United States Patent
Marks et al.

(10) Patent No.: US 8,274,075 B2
(45) Date of Patent: *Sep. 25, 2012

(54) CROSSLINKED POLYMERIC DIELECTRIC MATERIALS AND ELECTRONIC DEVICES INCORPORATING SAME

(75) Inventors: Tobin J. Marks, Evanston, IL (US); Antonio Facchetti, Chicago, IL (US); Zhiming Wang, Chicago, IL (US); Hyuk-Jin Choi, Seoul (KR); Nae-Jeong Suh, legal representative, Seoul (KR)

(73) Assignee: Northwestern University, Evanston, IL (US)

( * ) Notice: Subject to any disclaimer, the term of this patent is extended or adjusted under 35 U.S.C. 154(b) by 199 days.

This patent is subject to a terminal disclaimer.

(21) Appl. No.: 12/763,495

(22) Filed: Apr. 20, 2010

(65) Prior Publication Data

US 2011/0024729 A1 Feb. 3, 2011

Related U.S. Application Data

(62) Division of application No. 11/823,859, filed on Jun. 28, 2007, now abandoned.

(60) Provisional application No. 60/816,952, filed on Jun. 28, 2006.

(51) Int. Cl.
*C23C 16/18* (2006.01)
*B05B 3/04* (2006.01)
*H01L 29/08* (2006.01)

(52) U.S. Cl. ............... 257/40; 528/10; 528/29; 528/43; 427/387

(58) Field of Classification Search ........... 257/401, 257/411, 40; 528/43, 29, 10; 427/387, 372.2, 427/412, 468, 515; 106/287.16, 287.14; 525/55–56; 524/401
See application file for complete search history.

(56) References Cited

U.S. PATENT DOCUMENTS

| | | | |
|---|---|---|---|
| 5,223,356 A | 6/1993 | Kumar et al. | 430/1 |
| 6,258,507 B1 | 7/2001 | Ochiai et al. | 430/270.1 |
| 6,380,271 B1 | 4/2002 | Enoki et al. | 521/77 |
| 6,458,310 B1 | 10/2002 | Liu | 264/425 |
| 6,585,914 B2 | 7/2003 | Marks et al. | 252/500 |
| 6,737,365 B1 | 5/2004 | Kloster et al. | 438/778 |
| 6,783,852 B2 | 8/2004 | Inada et al. | 428/364 |
| 6,891,237 B1 | 5/2005 | Bao et al. | 257/410 |
| 7,029,945 B2 | 4/2006 | Veres et al. | 438/99 |
| 7,098,525 B2 | 8/2006 | Bai et al. | 257/642 |
| 7,270,845 B2 | 9/2007 | Japp et al. | |
| 7,605,394 B2 * | 10/2009 | Marks et al. | 257/40 |
| 2004/0065929 A1 | 4/2004 | Koo et al. | 257/410 |
| 2004/0211989 A1 | 10/2004 | Armgarth et al. | 257/253 |
| 2004/0216641 A1 | 11/2004 | Hamada et al. | 106/287.16 |
| 2005/0001210 A1 | 1/2005 | Lee et al. | 257/40 |
| 2005/0019592 A1 | 1/2005 | Bai et al. | 428/461 |
| 2005/0176970 A1 | 8/2005 | Marks et al. | 549/41 |
| 2005/0202348 A1 * | 9/2005 | Nakayama et al. | 430/311 |
| 2006/0063351 A1 * | 3/2006 | Jain | 438/455 |
| 2006/0079616 A1 | 4/2006 | Kayanoki | 524/261 |
| 2006/0186401 A1 | 8/2006 | Marks et al. | 257/40 |
| 2006/0202195 A1 * | 9/2006 | Marks et al. | 257/40 |
| 2008/0161524 A1 | 7/2008 | Yan et al. | 526/321 |

FOREIGN PATENT DOCUMENTS

| | | |
|---|---|---|
| EP | 1 494 298 A2 | 1/2005 |
| GB | 1 517 746 | 7/1978 |
| JP | 2000-309752 | 11/2000 |
| JP | 2006/053557 | 2/2006 |
| WO | 2005/060624 | 7/2005 |

OTHER PUBLICATIONS

Facchetti et al., "Gate Dielectrics for Organic Field-Effect Transistors: New Opportunities for Organic Electronics," *Adv. Mater.*, 2005: 17, 1705-1725.

Jong et al., "Miscibility Study of Poly(styrene-co-vinylphenol) with Poly(n-butyl methacrylate) by NMR," *Macromolecules*, 1990: 23, 5071-5074.

Kabeta et al., "Preparation of Substituted Network Polysilanes by a Disproportionation Reaction of Alkoxydisilanes in the Presence of Alkoxysilanes," *J. Polym. Sci. A: Polym. Chem.*, 1996: 34(14), 2991-2998.

Park et al., "Grafting of Polycaprolactone onto Poly(ethylene-co-vinyl alcohol) and Application to Polyethylene-based Bioerodable Blends," *J. Polym. Sci. B: Polym. Phys.*, 2002: 40(22), 2561-2569.

Yan et al., "Organic field-effect transistors based on a crosslinkable polymer blend as the semiconducting layer," *Applied Physics Letters*, 2005: 87, 183501-1-183501-3.

Yoon et al., "Low-Voltage Organic Field-Effect Transistors and Inverters Enabled by Ultrathin Cross-linked Polymers as Gate Dielectrics," *J. Am. Chem. Soc.*, 2005: 127, 10388-10395.

* cited by examiner

*Primary Examiner* — Vasu Jagannathan
*Assistant Examiner* — Hannah Pak
(74) *Attorney, Agent, or Firm* — Karen K. Chan

(57) ABSTRACT

Solution-processable dielectric materials are provided, along with precursor compositions and processes for preparing the same. Composites and electronic devices including the dielectric materials also are provided.

20 Claims, 8 Drawing Sheets

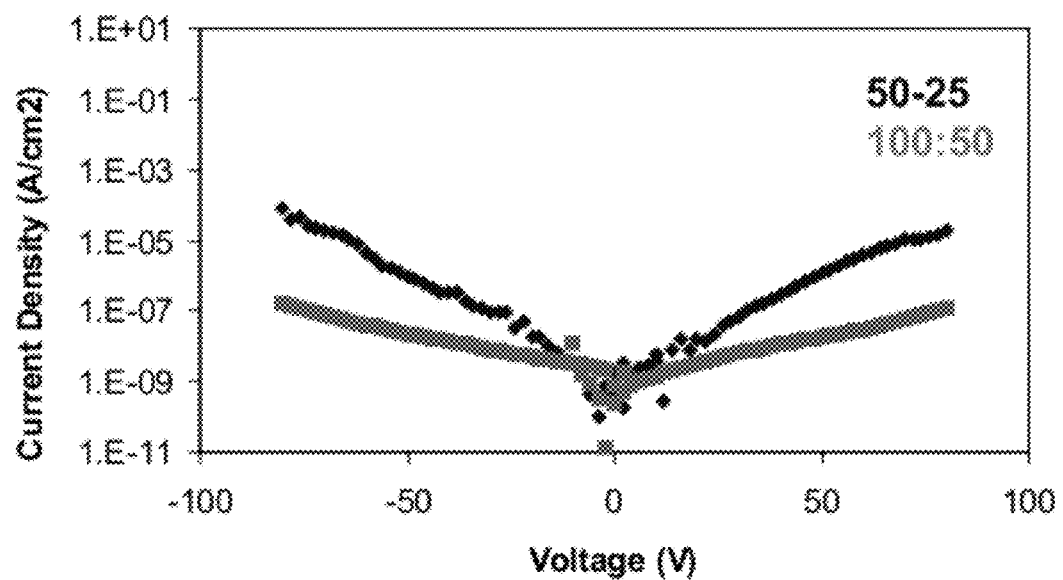
Figure 9
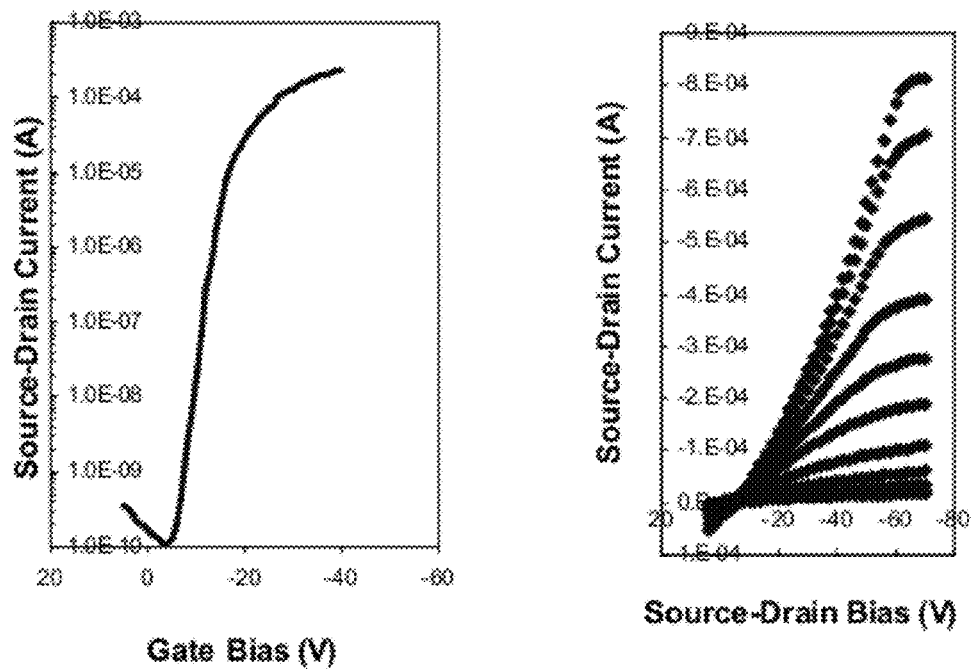
Figure 10A                    Figure 10B

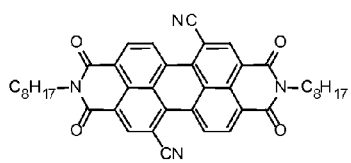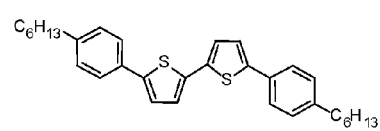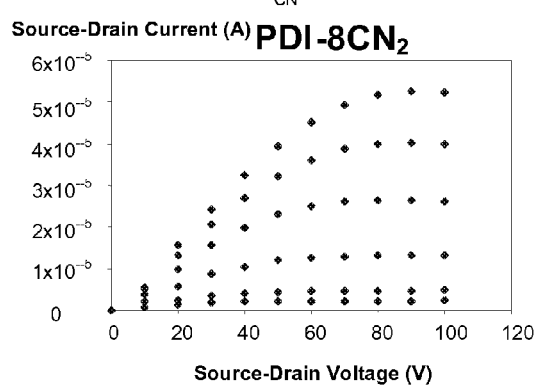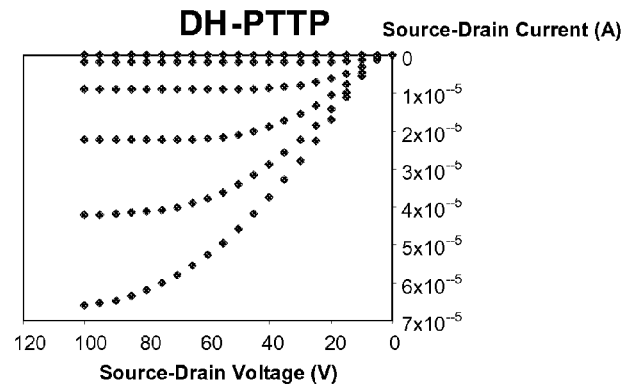
Figure 11A
Figure 11B

CROSSLINKED POLYMERIC DIELECTRIC MATERIALS AND ELECTRONIC DEVICES INCORPORATING SAME

CROSS REFERENCE TO RELATED APPLICATIONS

This application is a divisional application of U.S. patent application Ser. No. 11/823,859, filed on Jun. 28, 2007, which claims priority to and the benefit of U.S. Provisional Patent Application Ser. No. 60/816,952, filed on Jun. 28, 2006, the disclosure of each of which is incorporated by reference in its entirety.

STATEMENT REGARDING FEDERALLY SPONSORED RESEARCH OR DEVELOPMENT

This invention was made with government support under Grant No. N00014-02-1-0909 awarded by the Office of Naval Research, Grant No. DMR-0076097 awarded by the National Science Foundation, and Grant No. NCC-2-1363 awarded by the National Aeronautics and Space Administration (NASA). The government has certain rights in the invention.

BACKGROUND

The development of polymeric dielectric materials has been fundamental for the progress of both traditional and organic electronic devices. In particular, emerging display and labeling technologies based on organic thin-film transistors (OTFTs), such as electronic paper and radiofrequency identification (RFID) cards, require fabrication of OTFTs on flexible plastic substrates over very large areas and via high throughput processes. Therefore, there has been considerable effort in developing new materials for OTFT components (semiconductor, dielectric, and contacts) that can be deposited via solution-processing methods such as spin-coating, casting, and printing.

Many organic semiconductors are readily deposited from solution either directly or as molecular/polymeric soluble precursors which are then converted into the insoluble form. Doped conjugated polymers and nanoparticle-based conductive inks allow solution fabrication of sufficiently low resistivity lines for source/drain and gate contact applications.

Although various polymers have been employed as dielectrics for OTFTs, two major limitations with current-generation polymeric dielectric-based OTFTs exist. First, OTFTs function at relatively large operating voltages due to the intrinsically low (compared to crystalline semiconductors) semiconductor charge carrier mobilities. Second, because very few polymeric dielectric materials can perform optimally with a wide range of both hole-transporting (p-type) and electron-transporting (n-type) organic semiconductors, there has been limited complementary circuit application. These problems are exacerbated when printed dielectric/circuits are fabricated.

In a typical organic field effect transistor (OFET), the conductance of the source-drain channel region is modulated by the source-gate electric field ($E_G$). When the device is in the off-state ($E_G=0$), the channel conductance is very low (typically $>10^{12}\Omega$). When the device is in the on-state ($E_G \neq 0$), a sharp increase in conductance is observed ($<10^6\Omega$), and the output current flow (in saturation) between the source and the drain ($I_{DS}$) is defined by:

$$I_{DS} = \frac{W}{2L}\mu C_i[V_G - V_T]^2 \quad \text{(Eq. 1)}$$

where W is the width of the channel, L is the length of the channel, $\mu$ is the semiconductor charge carrier mobility, $C_i$ is the dielectric capacitance per unit area, $V_G$ is the source-gate voltage, and $V_T$ is the threshold voltage. It can be seen that for a given device geometry and semiconductor, equivalent current gains ($I_{DS}$) can be achieved at lower operating biases by increasing $C_i$.

Because $$C_i = \varepsilon_0 \frac{k}{d}, \quad \text{(Eq. 2)}$$

where k is the dielectric constant, $\varepsilon_0$ is the vacuum permittivity, and d is the thickness of the dielectric material, $C_i$ is increased when k increases and/or d decreases. However, k of most insulating polymers is low (~3-6). Additionally, most insulating polymers need to be quite thick (usually ~1 µm) to avoid considerable current leakage through the gate electrode.

To reduce current leakage for thinner films, polymeric dielectrics such as crosslinked melamine/$Cr^{6+}$ salts-polyvinylphenol (PVP) and crosslinked benzocyclobutene (BCB) have been introduced. However, these polymer films require high annealing temperatures and $C_i$ values are typically <<20 nF cm$^{-2}$.

Furthermore, the choice of dielectric material can affect $\mu$, which is an important device parameter. In particular, the gate dielectric permits the creation of the gate field and the establishment of the two-dimensional channel charge sheet. Upon application of a source-drain bias, the accumulated charges move very close to the dielectric-semiconductor interface from the source electrode to the drain electrode. Therefore, the nature of the dielectric-semiconductor interface, more particularly, the dielectric surface morphology prior to the deposition of the semiconductor material, can greatly affect how these charges move within the semiconductor, i.e., the carrier mobility. Moreover, the surface morphology of the dielectric material and variations in its surface energies (e.g., surface treatment via self-assembled monolayers) have been shown to modify the growth, morphology, and microstructure of the vapor/solution-deposited semiconductor, each of these being a factor affecting $\mu$ and $I_{on}$:$I_{off}$, the latter being the drain-source current ratio between the "on" and "off" states, another important device parameter. The properties of the dielectric material can also affect the density of state distribution for both amorphous and single-crystal semiconductors.

It is also desirable to have dielectric materials that adhere well to diverse substrates, i.e., the dielectric materials do not delaminate easily, to ensure device integrity under operating conditions, and to have dielectric materials that are hydrophobic such that device performance is not affected by humidity.

Accordingly, there is a desire in the art for polymeric dielectric materials that can exhibit relatively high capacitance and low current leakage, that can be prepared from commercially available polymer/molecular precursors via solution processes at low temperatures and atmospheric pressures, that can be compatible with diverse gate materials and semiconductors, that can adhere well to various substrates, and that can be resistant to the absorption of ambient moisture.

SUMMARY

In light of the foregoing, the present teachings provide dielectric materials and related precursor compositions and/or associated devices that address various deficiencies and shortcomings of the prior art, including some of those outlined above.

In one aspect, the present teachings provide a precursor composition that includes in solution at least one of (i) a polymeric component and a crosslinker component, and (ii) a polymeric crosslinker that includes a pendant group having a thermally curable crosslinking moiety. The composition is adapted to form a dielectric material after crosslinking (e.g., by thermally curing) the precursor composition. The crosslinker component can include a thermally curable crosslinker having the formula:

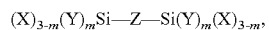

and the polymeric crosslinker can include a thermally curable crosslinking moiety having the formula:

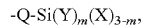

wherein Q, X, Y, Z, and m are as defined herein.

For example, thermally curable crosslinkers of the present teachings can include $[CH_3C(O)O]_3Si—(CH_2)_3—O—(CH_2)_2—O—(CH_2)_3—Si[CH_3C(O)O]_3$, $Cl_3Si—(CH_2)_3—O—(CH_2)_2—O—(CH_2)_3—SiCl_3$, $(CH_3O)_3Si—(CH_2)_2$-phenyl-$(CH_2)_2—Si(OCH_3)_3$, $Cl_3Si—(CH_2)_2—(CF_2)_2—(CH_2)_2—SiCl_3$, and $[CH_3C(O)O]_3Si—(CH_2)_2(CF_2)_2(CH_2)_2—Si[CH_3C(O)O]_3$.

An exemplary polymeric crosslinker having a thermally curable crosslinking moiety according to the present teachings can have the formula:

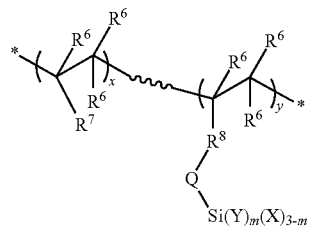

wherein $R^6$, $R^7$, $R^8$, Q, X, Y, and m are as defined herein.

In certain embodiments, the precursor composition can further include at least one of (iii) a crosslinker component comprising a photochemically curable crosslinker and (iv) a photochemically curable polymeric crosslinker. Such photochemically curable crosslinkers typically include an alkenyl group (i.e., one or more double bonds), for example, an allyl group, a phenylethenyl group, or a cinnamoyl group.

In some embodiments, the polymeric component of the composition can include a polymer selected from a polyalkylene, a substituted polyalkylene, a siloxane polymer and a copolymer thereof. Examples of polyalkylenes and substituted polyalkylenes include, but are not limited to, polyethylenes, polypropylenes, polyvinylalcohols, polystyrenes, ring-functionalized derivatives of polystyrenes (e.g. polyvinylphenol (PVP)), and polyacrylates (e.g., polymethylmethacrylates (PMMA)).

At least one of the polymeric component and the crosslinker component typically is dissolved in an anhydrous solvent. The anhydrous solvent can be selected from ethyl acetate, dioxane, bis(2-methoxyethyl)ether (diglyme), tetrahydrofuran, toluene, xylene, various alcohols including methanol and ethanol, and various ketones including acetone, cyclopentanone (CP), methylethylketone, and the like.

In some embodiments, the precursor composition can further include a metal oxide component, for example, to increase the dielectric constant (k) of a dielectric formed from the composition. The metal oxide component can be in particulate form and can be blended, mixed and/or incorporated in the composition. The metal oxide component can include a metal component selected from a Group I metal, a Group II metal, a Group III metal, a Group IV metal, a transition metal, and combinations thereof.

In another aspect, the present teachings provide dielectric materials that include a crosslinked polymeric material that is a thermally cured product and/or a photochemically cured product of any of the precursor compositions described above. Also embraced with the scope of the present teachings are various compositions, composites (e.g., structures) and articles of manufacture (e.g., electronic devices) that incorporate the dielectric materials disclosed herein. Examples of electronic devices that can incorporate one or more dielectric materials of the present teachings include, but are not limited to, organic thin film transistors (OTFTs) (e.g., organic field effect transistors (OFETs)) and capacitors. In addition to a dielectric component, these devices can include, for example, a substrate component, a semiconductor component, and/or one or more metallic contact components.

In a further aspect, the present teachings provide various methods for preparing a dielectric material. The methods can include applying a precursor composition of the present teachings onto a substrate, and thermally curing the precursor composition (i.e., the coated substrate) to provide a dielectric material. The applying step can be performed by, for example, spin-coating, printing, spraying, or casting. In some embodiments, the curing step can include heating at a temperature within a range of about 70° C. to about 150° C. in a high humidity atmosphere. In embodiments in which the precursor composition includes a photochemically curable crosslinker, the curing step can include exposing the precursor composition (i.e., the coated substrate) to ultraviolet light, e.g., by irradiation at a wavelength of about 245 nm. For a dielectric precursor composition that includes both a thermally curable crosslinker and a photochemically curable crosslinker, the curing step can include first heating at a temperature within a range of about 70° C. and about 150° C. in a high humidity atmosphere, followed by irradiation with a wavelength of about 245 nm, or vice versa. In some embodiments, the crosslinking reaction can be achieved by electron beam irradiation.

The foregoing as well as other features and advantages of the present teachings, will be more fully understood from the following figures, description, and claims.

BRIEF DESCRIPTION OF THE DRAWINGS

It should be understood that the drawings described below are for illustration purposes only and are not necessarily to scale. The drawings are not intended to limit the scope of the present teachings in any way.

FIG. 9 is a plot of leakage current density versus applied bias for two embodiments of dielectric precursor compositions of the present teachings.

FIG. 10 shows a transfer plot (A) and an output plot (B) for a pentacene-OFET that includes a dielectric material of the present teachings.

FIG. 11 shows output plots for an OFET including a dielectric layer of the present teachings and an organic semiconductor layer prepared with N,N'-bis(n-octyl)-(1,7 and 1,6)-dicyanoperylene-3, 4:9,10-bis(dicarboximide) ($PDI-8CN_2$) (A), and an OFET including a dielectric layer of the present teachings and an organic semiconductor layer prepared with bis(n-hexylphenyl)dithiophene (DH-PTTP) (B).

DETAILED DESCRIPTION

Figure 1:
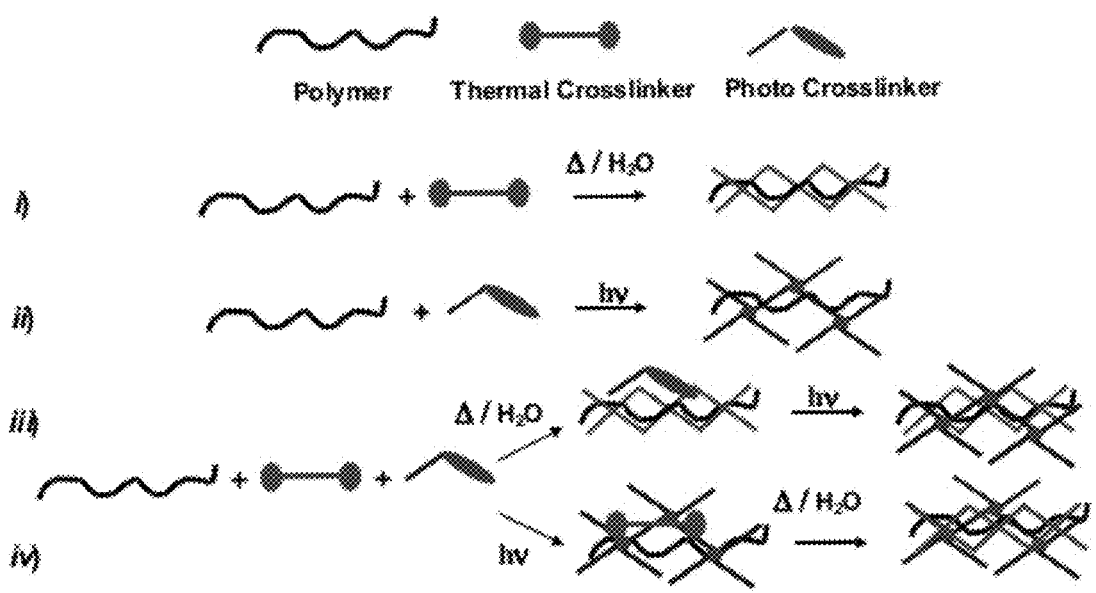
FIG. 1 is a schematic representation of different crosslinking strategies that can be employed using dielectric precursor compositions of the present teachings.

The present teachings relate to dielectric materials and precursor compositions for preparing the same, as well as to electronic devices that include such dielectric materials.

The present teachings provide crosslinked polymeric dielectric materials that can exhibit good insulating properties (e.g., with leakage currents in the order of $\sim 10^{-6}$-$10^{-7}$ $A/cm^2$) and can be fabricated using low-temperature solution processes (e.g., spin-coating and printing). Solution-processed thin films (<300 nm) of the present dielectric materials can exhibit high mechanical flexibility and have very smooth surfaces. The dielectric materials disclosed herein were found to adhere well to different substrates (e.g., gate materials such as doped silicon, aluminum, and indium tin oxide) and can be compatible with a wide range of p-type and n-type organic and inorganic semiconductors, making them attractive materials for fabricating various organic electronic devices. For example, organic thin film transistors (OTFTs) incorporating dielectric materials of the present teachings can operate at low biases, hence minimizing power consumption, particularly when the dielectric materials of the present teachings are in the form of ultra-thin films (<about 50 nm), which can exhibit capacitance as high as ~300 nF $cm^{-2}$.

More specifically, the present teachings provide dielectric materials that include crosslinked polymeric matrices in which polymeric chains can be either covalently crosslinked by one or more thermally curable and/or photochemically curable crosslinkers, or embedded within or otherwise incorporated (e.g., mixed or blended) in a crosslinked matrix formed by the thermally curable and/or photochemically curable crosslinkers. These crosslinked polymeric matrices can be structurally robust and can exhibit good insulating properties. The present teachings also provide precursor compositions that can enable high-throughput fabrication (e.g., via fast and quantitative reactions under mild conditions) of such dielectric materials.

Throughout the description, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited processing steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise.

It should be understood that the order of steps or order for performing certain actions is immaterial so long as the present teachings remain operable. Moreover, two or more steps or actions may be conducted simultaneously.

As used herein, "polymer" or "polymeric compound" refers to a molecule including at least three or more repeating units connected by covalent chemical bonds. The polymer or polymeric compound can have only one type of repeating unit as well as two or more types of different repeating units. In the latter case, the term "copolymer" or "copolymeric compound" can be used herein instead, especially when the polymer includes chemically significantly different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. The polymer can include one or more pendant groups. As used herein, a "pendant group" refers to a moiety that is substituted on the backbone of a polymer.

As used herein, "solution-processable" refers to compounds, materials, or compositions that can be used in various solution-phase processes including spin-coating, printing (e.g., inkjet printing), spray coating, electrospray coating, drop casting, dip coating, and blade coating.

As used herein, "halo" or "halogen" refers to fluoro, chloro, bromo, and iodo.

As used herein, "alkoxy" refers to —O-alkyl group. Examples of alkoxy groups include, but are not limited to, methoxy, ethoxy, propoxy (e.g., n-propoxy and isopropoxy), t-butoxy groups, and the like.

As used herein, "alkyl" refers to a straight-chain or branched saturated hydrocarbon group. Examples of alkyl groups include methyl (Me), ethyl (Et), propyl (e.g., n-propyl and isopropyl), butyl (e.g., n-butyl, isobutyl, s-butyl, t-butyl), pentyl groups (e.g., n-pentyl, isopentyl, neopentyl), and the like. A lower alkyl group typically has up to 4 carbon atoms. Examples of lower alkyl groups include methyl, ethyl, propyl (e.g., n-propyl and isopropyl), and butyl groups (e.g., n-butyl, isobutyl, s-butyl, t-butyl).

As used herein, "haloalkyl" refers to an alkyl group having one or more halogen substituents. Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups wherein all of the hydrogen atoms are replaced with halogen atoms (e.g., $CF_3$ and $C_2F_5$), are included within the definition of "haloalkyl." For example, a $C_{1-20}$ haloalkyl group can have the formula —$C_aX_{2a+1}$— or —$C_aH_{2a+1}X_b$—, wherein X is F, Cl, Br, or I, a is an integer in the range of 1 to 20, and b is an integer in the range of 0 to 40, provided that $b \leq 2a+1$.

As used herein, "arylalkyl" refers to an -alkyl-aryl group, wherein the arylalkyl group is covalently linked to the defined chemical structure via the alkyl group. An arylalkyl group is within the definition of an -L-$C_{6-14}$ aryl group, wherein L is as defined herein. An example of an arylalkyl group is a benzyl group (—$CH_2$—$C_6H_5$). An arylalkyl group can be optionally substituted, i.e., the aryl group and/or the alkyl group can be substituted as disclosed herein.

As used herein, "alkenyl" refers to a straight-chain or branched alkyl group having one or more carbon-carbon double bonds. Examples of alkenyl groups include, but are not limited to, ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene).

As used herein, "cycloalkyl" refers to a non-aromatic carbocyclic group including cyclized alkyl, alkenyl, and alkynyl groups. A cycloalkyl group can be monocyclic (e.g., cyclohexyl) or polycyclic (e.g., containing fused, bridged, and/or spiro ring systems), wherein the carbon atoms are located inside or outside of the ring system. Any suitable ring position of the cycloalkyl group can be covalently linked to the defined chemical structure. Examples of cycloalkyl groups include, but are not limited to, cyclopropyl, cyclopropylmethyl, cyclobutyl, cyclopentyl, cyclohexyl, cyclohexylmethyl, cyclohexylethyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as disclosed herein.

As used herein, "heteroatom" refers to an atom of any element other than carbon or hydrogen and includes, for example, nitrogen, oxygen, sulfur, phosphorus, and selenium.

As used herein, "cycloheteroalkyl" refers to a non-aromatic cycloalkyl group that contains at least one ring heteroatom selected from O, N and S, and optionally contains one or more double or triple bonds. One or more N or S atoms in a cycloheteroalkyl ring may be oxidized (e.g., morpholine N-oxide, thiomorpholine S-oxide, thiomorpholine S,S-dioxide). In some embodiments, nitrogen atoms of cycloheteroalkyl groups can bear a substituent, for example, a hydrogen atom, an alkyl group, or other substituents as described herein. Cycloheteroalkyl groups can also contain one or more oxo groups, such as piperidone, oxazolidinone, pyrimidine-2,4(1H,3H)-dione, pyridin-2(1H)-one, and the like. Examples of cycloheteroalkyl groups include, among others, morpholine, thiomorpholine, pyran, imidazolidine, imidazoline, oxazolidine, pyrazolidine, pyrazoline, pyrrolidine, pyrroline, tetrahydrofuran, tetrahydrothiophene, piperidine, piperazine, and the like. In some embodiments, cycloheteroalkyl groups can be substituted as disclosed herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have from 6 to 14 carbon atoms in its ring system, which can include multiple fused rings. In some embodiments, a polycyclic aryl group can have from 8 to 14 carbon atoms. Any suitable ring position of the aryl group can be covalently linked to the defined chemical structure. Examples of aryl groups having only aromatic carbocyclic ring(s) include, but are not limited to, phenyl, 1-naphthyl (bicyclic), 2-naphthyl (bicyclic), anthracenyl (tricyclic), phenanthrenyl(tricyclic) and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include, but are not limited to, benzodioxanyl, benzodioxolyl, chromanyl, indolinyl groups, and the like. In some embodiments, aryl groups can be substituted as disclosed herein.

As used herein, "heteroaryl" refers to an aromatic monocyclic ring system containing at least 1 ring heteroatom selected from oxygen (O), nitrogen (N) and sulfur (S) or a polycyclic ring system where at least one of the rings present in the ring system is aromatic and contains at least 1 ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, from 5 to 14 ring atoms and contain 1-5 ring heteroatoms. The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5-membered monocyclic and 5-6 bicyclic ring systems shown below:

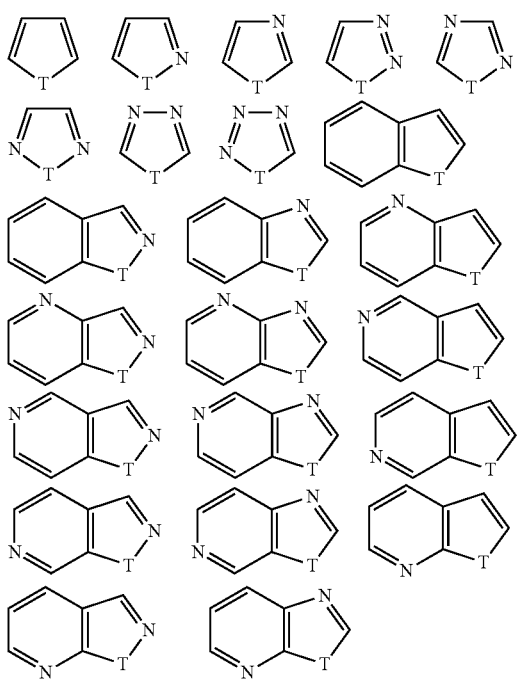

where T is O, S, NH, N-alkyl, N-aryl, or N-(arylalkyl) (e.g., N-benzyl). Examples of such heteroaryl rings include, but are not limited to, pyrrole, furan, thiophene, pyridine, pyrimidine, pyridazine, pyrazine, triazole, tetrazole, pyrazole, imidazole, isothiazole, thiazole, thiadiazole, isoxazole, oxazole, oxadiazole, indole, isoindole, benzofuran, benzothiophene, quinoline, 2-methylquinoline, isoquinoline, quinoxaline, quinazoline, benzotriazole, benzimidazole, benzothiazole, benzisothiazole, benzisoxazole, benzoxadiazole, benzoxazole, cinnoline, 1H-indazole, 2H-indazole, indolizine, isobenzofuran, naphthyridine, phthalazine, pteridine, purine, oxazolopyridine, thiazolopyridine, imidazopyridine, furopyridine, thienopyridine, pyridopyrimidine, pyridopyrazine, pyridopyridazine, thienothiazole, thienoxazole, and thienoimidazole. Further examples of heteroaryl groups include, but are not limited to, 4,5,6,7-tetrahydroindole, tetrahydroquinoline, benzothienopyridine, benzofuropyridine, and the like. In some embodiments, heteroaryl groups can be substituted as disclosed herein.

At various places in the present specification, substituents of compounds are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2,3,4,5,6,7,8,9,10,11,12,13,14,15,16,17,18,19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Throughout the specification, structures may or may not be presented with chemical names. Where any question arises as to nomenclature, the structure prevails.

The present teachings provide precursor compositions including one or more polymers (i.e., a polymeric component) and one or more crosslinking moieties or crosslinkers (i.e., a crosslinker component) which, upon crosslinking (e.g., by thermally curing or photochemically curing), can provide crosslinked polymeric materials that are suitable for use as dielectric materials. In some embodiments, the precursor composition can include the polymeric component and the crosslinker component as separate chemical moieties. For example, the crosslinker component can include one or more crosslinkers that are small molecule compounds having one or more crosslinking groups. In other embodiments, the polymeric component and the crosslinker component can be chemically combined in the form of a polymeric crosslinker, specifically, a polymer having one or more pendant crosslinking groups on its backbone. The precursor composition can include one or more solvents in which at least one of the polymeric component and the crosslinker component is substantially soluble.

In some embodiments, the crosslinker component of the precursor composition can include thermally curable crosslinkers that include two or more silyl groups. These silyl groups can include one or more (e.g., one, two, or three) hydrolyzable moieties such as halo groups, amino groups, alkoxy groups, and carboxylate groups that can react with OH groups and induce crosslinking. For example, the thermally curable crosslinkers can have the formula:

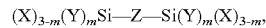

and (ii) a polymeric crosslinker comprising a pendant group, the pendant group comprising a thermally curable crosslinking moiety having the formula:

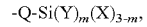

wherein:
m, at each occurrence, is independently selected from 0, 1, and 2;
X, at each occurrence, is independently selected from a halogen, —$NR^1R^2$, —$OR^3$, and —$OC(O)R^3$;
Y, at each occurrence, is independently selected from H, a $C_{1-6}$ alkyl group, and a $C_{1-6}$ haloalkyl group;
Z is Q-W-Q; and
Q, at each occurrence, is independently selected from -L-, —O—, —O-L-, -L-O—, —$NR^4$—, —$NR^4$-L-, -L-$NR^4$—, and a covalent bond;
wherein:
L, at each occurrence, is independently a divalent $C_{1-10}$ alkyl group or a divalent $C_{1-10}$ haloalkyl group, each of which is optionally substituted with 1-4 $R^4$ groups;
W is selected from —SiXX—, —SiXY—, —SiYY—, —SiXX—O—, —O—SiXX—, —SiXY—O—, —O—SiXY—, —SiYY—O—, —O—SiYY—, —O—{[($CR^4_2$)$_t$—O]$_p$—[($CR^5_2$)$_t$—O]$_q$}—, a divalent $C_{6-14}$ aryl group, a divalent 5-14 membered heteroaryl group, and a covalent bond, wherein each of the divalent $C_{6-14}$ aryl group and the divalent 5-14 membered heteroaryl group is optionally substituted with 1-4 $R^4$ groups;
$R^1$ and $R^2$ are independently selected from H, a $C_{1-6}$ alkyl group, a $C_{6-14}$ aryl group, a 5-14 membered heteroaryl group, a —$C_{1-6}$ alkyl-$C_{6-14}$ aryl group, and a —$C_{1-6}$ alkyl-5-14 membered heteroaryl group;
$R^3$ is selected from H, a $C_{1-6}$ alkyl group, a $C_{1-6}$ haloalkyl group, a $C_{2-6}$ alkenyl group, a $C_{2-6}$ alkynyl group, a $C_{6-14}$ aryl group, a 5-14 membered heteroaryl group, a —$C_{1-6}$ alkyl-$C_{6-14}$ aryl group, and a —$C_{1-6}$ alkyl-5-14 membered heteroaryl group;

$R^4$ and $R^5$, at each occurrence, are independently selected from H, a halogen, a $C_{1-6}$ alkyl group, a $C_{1-6}$ haloalkyl group, a $C_{6-14}$ aryl group, a 5-14 membered heteroaryl group, a —$C_{1-6}$ alkyl-$C_{6-14}$ aryl group, a —$C_{1-6}$ alkyl-5-14 membered heteroaryl group, and -Q-Si(Y)$_m$(X)$_{3-m}$;

t, at each occurrence, is independently 1, 2, 3, 4, 5 or 6;

p is 0, 1, 2, 3, 4, 5, 6, 7, 8, 9, 10, 11, 12, 13, 14, 15, 16, 17, 18 or 19; and q is 1, 2, 3, 4, 5, 6, 7, 8, 9, 10, 11, 12, 13, 14, 15, 16, 17, 18, 19 or 20, provided that p+q≦20.

In certain embodiments, X, at each occurrence, can be independently selected from Cl, OCH$_3$, OCH$_2$CH$_3$, —N(CH$_3$)$_2$—, —N(CH$_2$CH$_3$)$_2$—, —OC(O)CH$_3$, and —OC(O)CH$_2$CH$_3$; and Y, at each occurrence, can be independently selected from H, CF$_3$, a methyl group, and an ethyl group. For example, the thermally curable crosslinkers can be α,ω-bis-functionalized with SiX$_3$ groups, wherein X is selected from Cl, OCH$_3$, OCH$_2$CH$_3$, —N(CH$_3$)$_2$—, —N(CH$_2$CH$_3$)$_2$—, —OC(O)CH$_3$, and —OC(O)CH$_2$CH$_3$.

It should be understood that the linker Z, as defined above, can exclude certain combinations of Q-W-Q. For example, it should be understood that Z cannot be —O—, a divalent $C_{1-20}$ alkyl group, or a covalent bond.

In some embodiments, Z can be a divalent linker that can be symmetrical or asymmetrical. In certain embodiments, Q, at each occurrence, can be independently selected from —O—, a divalent $C_{1-10}$ alkyl group (e.g., —(CH$_2$)$_t$—), a divalent $C_{1-10}$ haloalkyl group (e.g., —(CF$_2$)$_t$—), and a covalent bond; and W can be selected from —O—[(CR$^4_2$)$_t$—O]$_p$—[(CR$^5_2$)$_t$—O]$_q$— (e.g., —O—[(CH$_2$)$_2$—O]$_t$— and —O—[(CF$_2$)$_2$—O]$_t$—), a divalent phenyl group, and a covalent bond, wherein $R^4$ and $R^5$ can be independently H or F, and p, q, and t are as defined herein. In particular embodiments, Z can be an alkylene glycol linker. For example, Z can be Q-W-Q, wherein Q, at each occurrence, is independently a divalent $C_{1-6}$ alkyl group or a covalent bond, and W is —O—{[(CH$_2$)$_3$—O]$_p$—[(CH$_2$)$_2$—O]$_q$}—, wherein p is 0, 1, 2, 3, 4, 5 or 6, and q is 1, 2, 3, 4, 5 or 6.

Crosslinkers according to the formula given above include, but are not limited to,

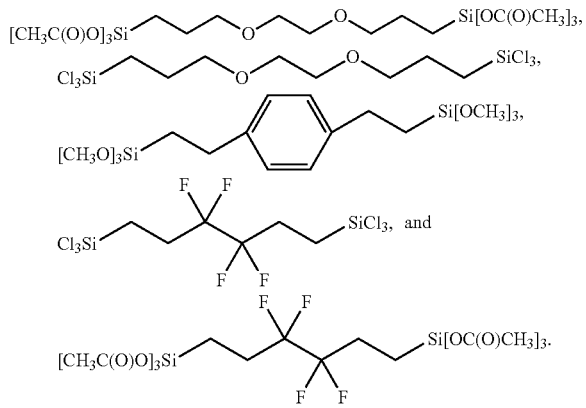

In certain embodiments, Z can include one or more -Q-Si(Y)$_m$(X)$_{3-m}$ substituents to provide additional groups for crosslinking For example, Z can be Q-W-Q, wherein Q, at each occurrence, can be independently a divalent $C_{1-10}$ alkyl group or a divalent $C_{1-10}$ haloalkyl group, and W can be selected from —O—[(CR$^4_2$)$_t$—O]$_p$—[(CR$^5_2$)$_t$—O]$_q$— and a divalent phenyl group, wherein the divalent $C_{1-10}$ alkyl group, the divalent $C_{1-10}$ haloalkyl group, and the divalent phenyl group can be substituted with 1-4 -Q-Si(Y)$_m$(X)$_{3-m}$ groups (thereby creating a higher order valency group, e.g., a trivalent or tetravalent phenyl group), $R^4$ and $R^5$ can be independently H, F, or -Q-Si(Y)$_m$(X)$_{3-m}$, and Q, X, Y, m, p, q, and t are as defined herein. A non-limiting example of these embodiments is a crosslinker having the formula:

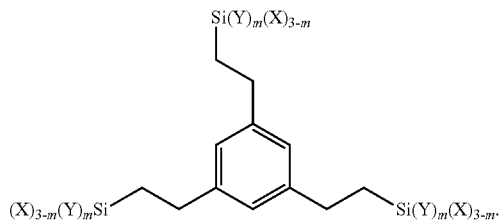

As aforementioned, the precursor composition can include a polymeric crosslinker, i.e., a polymer having one or more crosslinking pendant groups. For example, the pendant group can include a thermally curable crosslinking moiety having the formula:

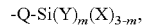

wherein Q, X, Y, and m are as defined herein. In certain embodiments, the thermally curable polymeric crosslinker can have the formula:

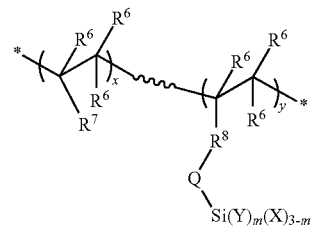

wherein:

$R^6$, at each occurrence, is independently H, a halogen, or a $C_{1-6}$ alkyl group;

$R^7$ is selected from H, OH, a halogen, C(O)O—$R^3$, a $C_{1-6}$ alkyl group, a $C_{1-6}$ haloalkyl group, a $C_{6-14}$ aryl group, a 5-14 membered heteroaryl group, a 3-14 membered cycloheteroalkyl group, a —$C_{1-6}$ alkyl-$C_{6-14}$ aryl group, a —$C_{1-6}$ alkyl-5-14 membered heteroaryl group, and a —$C_{1-6}$ alkyl-3-14 membered cycloheteroalkyl group, wherein each of the $C_{6-14}$ aryl groups, the 5-14 membered heteroaryl groups, and the 3-14 membered cycloheteroalkyl groups is optionally substituted with 1-5 substituents independently selected from a halogen, an oxo group, OH, CN, NO$_2$, C(O)O—$C_{1-6}$ alkyl, a $C_{1-6}$ alkyl group, a $C_{1-6}$ alkoxy group, and a $C_{1-6}$ haloalkyl group;

$R^8$ is selected from —O—, —C(O)O—, a divalent $C_{1-6}$ alkyl group, and a divalent phenyl group;

x and y are independently a real number, wherein 0<x<1, 0<y<1, and x+y=1; and

Q, X, Y and m are as defined herein.

In some embodiments of the polymeric crosslinker having the formula described above, $R^6$, at each occurrence, can be H or a methyl group; $R^7$ can be selected from H, OH, a methyl group, $C(O)O$—$C_{1-6}$ alkyl, and a phenyl group optionally substituted with OH or —O—$C_{1-6}$ alkyl; $R^8$ can be selected from —O—, —C(O)O—, a divalent $C_{1-4}$ alkyl group, and a divalent phenyl group; and Q can be selected from -L-, —O-L-, and a covalent bond, wherein L is as defined herein. A non-limiting example of such a thermally curable polymeric crosslinker is

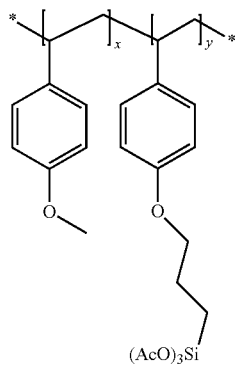

wherein Ac is an acetyl group (i.e., $CH_3C(O)$—), and x and y are as defined herein.

Without wishing to be bound to any particular theory, crosslinking reactions with these thermally curable crosslinkers typically rely on the fast and quantitative coupling reactions of the functional groups (e.g., the one or more halo groups, alkoxy groups, amino groups, and carboxylate groups) on the silicon with water and/or the hydroxyl group(s) of a OH-functionalized molecule or polymer to produce a robust siloxane network.

To enable efficient patterning and enhance the robustness of the polymeric network even further, one or more photochemically curable crosslinkers can be utilized alone or in conjunction with one or more thermally curable crosslinkers. Such photochemically curable crosslinkers are well known in the art and typically include an alkenyl group (i.e., one or more double bonds), for example, an allyl group, a phenylethenyl group, or a cinnamoyl group.

In some embodiments, these photochemically curable crosslinkers are polymers that include one or more photochemically curable crosslinking groups. For example, a photochemically curable polymeric crosslinker can have the formula:

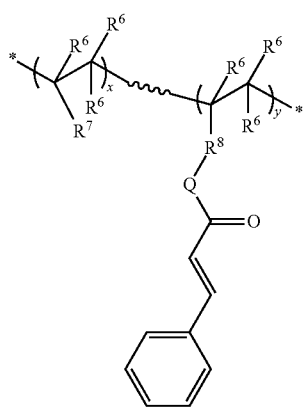

wherein $R^6$, $R^7$, $R^8$, Q, x and y are as defined herein.

Without wishing to be bound to any particular theory, the crosslinking chemistry involving these photochemically curable crosslinkers can consist of a 2+2 photo-stimulated cycloaddition that provides stable cyclobutane moieties. The crosslinking chemistry can also involve free radical additions.

The polymeric component of the precursor compositions described above can include various electrically non-conducting polymers, including those that have been used as dielectric materials. Examples include, but are not limited to, polyalkylenes, substituted polyalkylenes, siloxane polymers, and copolymers of polyalkylenes, substituted polyalkylenes, and/or siloxane polymers.

More specifically, polyalkylenes and substituted polyalkylenes can include, but are not limited to, polyethylenes (PE), polypropylenes (PP), polyvinylalcohols (PVA), polystyrenes (PS), ring-functionalized derivatives of polystyrenes (e.g., polyvinylphenols (PVP)), and polyacrylates (e.g., polymethylmethacrylates (PMMA)).

Siloxane polymers can have a repeating unit of the formula:

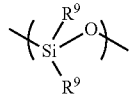

wherein $R^9$, at each occurrence, is independently selected from H, a $C_{1-6}$ alkyl group, a $C_{1-6}$ haloalkyl group, a $C_{6-14}$ aryl group, a 5-14 membered heteroaryl group, wherein each of the $C_{1-6}$ alkyl group, the $C_{6-14}$ aryl group, the 5-14 membered heteroaryl group can be optionally substituted with 1-5 substituents independently selected from a halogen, CN, OH, and a $C_{1-6}$ haloalkyl group. For example, the siloxane polymer can have the formula:

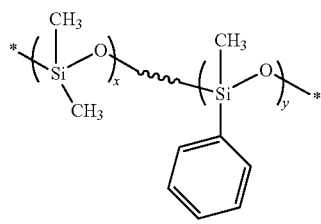

wherein x and y are as defined herein.

The precursor compositions described above also can include a metal oxide component. The metal oxide component typically has a high dielectric constant (k). Therefore, the incorporation of such a metal oxide component into a precursor composition can help increase the dielectric constant of the resulting dielectric material. The metal oxide component can be in particulate form and can be blended, mixed and/or otherwise incorporated in the composition. The metal oxide component can include a metal component selected from a Group I metal, a Group II metal, a Group III metal, a Group IV metal, a transition metal, and combinations thereof.

To provide desirable processing advantages, the various crosslinkers and polymers described above typically are somewhat soluble, and preferably highly soluble, in various solvents (e.g., various anhydrous solvents). The crosslinker component and the polymeric component can be dissolved in the same solvent or in different solvents before combining with each other to provide the precursor compositions of the present teachings. As used herein, a compound can be considered soluble in a solvent when at least 1 mg of the compound is soluble in 1 mL of the solvent. Examples of common solvents include petroleum ethers; acetonitrile; aromatic hydrocarbons such as benzene, toluene, xylene, and mesitylene; ketones such as acetone, cyclopentanone (CP), methyl ethyl ketone, and 2-butanone; ethers such as tetrahydrofuran (THF), dioxane, bis(2-methoxyethyl)ether (diglyme), diethyl ether, di-isopropyl ether, and t-butyl methyl ether; alcohols such as methanol, ethanol, butanol, and isopropyl alcohol; aliphatic hydrocarbons such as hexanes; acetates such as methyl acetate, ethyl acetate (EtOAc), methyl formate, ethyl formate, isopropyl acetate; and halogenated aliphatic and aromatic hydrocarbons such as dichloromethane, chloroform, ethylene chloride, chlorobenzene, dichlorobenzene, and trichlorobenzene.

The precursor compositions are adapted to form dielectric materials that can exhibit a wide range of desirable properties and characteristics. For example, the dielectric materials prepared from the precursor compositions described above can be very thin and pinhole-free, can have a high breakdown voltage and good long-term stability, can exhibit high capacitance and low current leakage, can show good adhesion to various substrates, and can be patterned using conventional techniques without delamination. The present dielectric materials also can demonstrate other advantageous characteristics such as, but not limited to, solution-processability, fabricability at low temperatures and/or atmospheric pressures, and compatibility with a diverse range of materials used in fabricating various electronic devices (e.g., thin film transistors, field-effect devices, organic light emitting diodes (OLEDs), organic photovoltaics, photodetectors, capacitors, and sensors).

To prepare a dielectric material in the form of a film using the precursor compositions of the present teachings, various film deposition techniques can be used. These techniques include casting (e.g., drop-casting), dip coating, blade coating, spraying, printing, and spin-coating. Spin-coating involves applying an excess amount of a precursor composition (e.g., a solution of a polymeric component and a crosslinker component) onto a substrate, then rotating the substrate at high speed to spread the fluid by centrifugal force. The thickness and the surface morphology of the resulting dielectric film prepared by this technique is dependent on the spin-coating rate, the concentration of the solution, as well as the solvent used. Printing can be performed, for example, with a rotogravure printing press, a flexo printing press, or an inkjet printer. The thickness of the dielectric film in these cases will similarly be dependent on the concentration of the solution, the choice of solvent, and the number of printing repetitions. Much of the printed electronics technology has focused on inkjet printing, primarily because this technique offers greater control over feature position and multilayer registration. Inkjet printing is a noncontact process, which offers the benefits of not requiring a preformed master (compared to contact printing techniques), as well as digital control of ink ejection, thereby providing drop-on-demand printing. However, contact printing techniques have the key advantage of being well-suited for very fast roll-to-roll processing. Exemplary contact printing techniques include screen-printing, gravure, offset, and microcontact printing.

The thickness of the dielectric materials of the present teachings can be controlled, and can be made as thin as 10 nm to several microns as established by profilometry and/or atomic force microscopy (AFM). For example, dielectric films prepared according to the present teachings can have a thickness range from about 10 nm to about 20 nm and up to 10 µm or more. Films of greater thicknesses, if desired or required, can be obtained by 1) multiple spin-on depositions/printing repetitions before curing, as the dielectric materials of the present teachings can be stable to and not adversely affected by precursor or processing solutions; or 2) adjusting and/or increasing the polymer precursor concentration(s). Generally, dielectric films of the present teachings are relatively thin (e.g., less than about 300 nm), and in some embodiments, ultra-thin (e.g., less than about 50 nm or less than about 30 nm).

Figure 2:
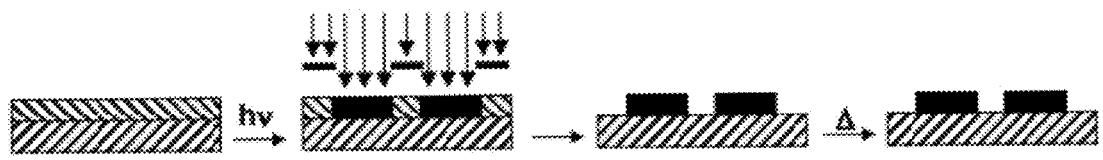
FIG. 2 is a schematic representation of a crosslinking-patterning process, illustrating in order: depositing a dielectric precursor composition onto a substrate, photochemically curing the coated substrate, washing the dielectric/substrate composite, and heating the dielectric material to induce further crosslinking/patterning.

Various curing or crosslinking strategies can be employed to form a crosslinked polymeric material from the precursor compositions described above. The crosslinked polymeric material can be a thermally cured product and/or a photochemically cured product of the precursor composition. For example, four different crosslinking strategies can be employed depending on the type and the order of the crosslinking chemistry. Referring to FIG. 1, these processes include: i) thermal/high-humidity curing; ii) photochemical curing; iii) thermal/ high-humidity curing followed by photochemical curing; and iv) photochemical curing followed by thermal/high-humidity curing. The thermal curing step can include annealing at an elevated temperature range in a high-humidity environment (~70%-90% humidity) for a short period of time (e.g., 5-10 minutes), followed by dry curing (e.g., in a vacuum oven) at a similar temperature range for a longer period of time (e.g., 1-3 hours). The elevated temperature range can be from about 70° C. to about 150° C., from about 90° C. to about 140° C., and from about 100° C. to about 130° C. The photocuring step can include exposure to ultraviolet light (e.g., irradiation with a wavelength of about 245 nm) for about 5-15 minutes depending on the thickness of the film. In some embodiments, crosslinking also can be achieved by electron beam irradiation alone or in conjunction with one or both of the techniques discussed above. Crosslinked polymeric dielectric materials with different and/or complementary properties can be obtained using one or more of these processes. The use of photochemically curable crosslinkers can facilitate patterning, for example, as illustrated in the process in FIG. 2.

Accordingly, fabrication of a dielectric material can be performed in air (e.g., in a simple fume hood) in a controllable manner. Silane hydrolysis, condensation, and/or crosslinking typically occurs within seconds after deposition under ambient conditions. The process can be optimized by using controlled-atmosphere conditions during film deposition and annealing.

The structural integrity of the resulting dielectric material can be evident by its insolubility in the mother solution. The curing temperatures, typically lower than 130° C., are compatible with common plastic substrates employed in organic electronics such as polyethylene terephthalate (PET) and polyethylene naphthalate (PEN). In addition, the crosslinking chemistry according to the present teachings can ensure strong adhesion to a substrate, for example, a bottom gate electrode, thus preventing delamination upon successive deposition and/or patterning of subsequent device layers, as well as during device operation.

The present teachings further provide an article of manufacture, for example, a composite, that comprises a dielectric material of the present teachings and a substrate component and/or a semiconductor component. The substrate component can be selected from, but is not limited to, a doped silicon, an indium tin oxide (ITO), ITO-coated glass, ITO-coated mylar, aluminum, a doped polythiophene, and the like. The composite can include a semiconductor component. The semiconductor component can be selected from, but is not limited to, various fused heterocycles, polythiophenes, fused aromatics, and other such semiconductor compounds or materials, whether p-type or n-type, otherwise known or found useful in the art. The semiconductor component also can include inorganic semiconductor materials such as silicon, germanium, gallium arsenide, and the like. One or more of the composites described above can be embodied within an organic electronic device such as an OTFT, specifically, an OFET. Such an OFET can operate at low biases due to the high capacitance of the dielectric materials of the present teachings.

In the following examples, dielectric materials according to the present teachings were prepared and characterized by AFM, metal-insulator-metal (MIM) device and metal-insulator-semiconductor (MIS) device leakage and impedance spectroscopy measurements, to demonstrate, among other things, their compatibility with various p-type and n-type organic semiconductors. Organic electronic devices, e.g., organic thin film transistors (OTFTs), specifically, organic field effect transistors (OFETs), based on these dielectric films also have been fabricated and characterized, data of which are provided below.

The following examples are provided to illustrate further and to facilitate the understanding of the present teachings and are not in any way intended to limit the invention.

EXAMPLE 1

Preparation of 1-trichlorosilanyl-3-[2-(3-trichlorosilanyl-propoxy)-ethoxy]propane (EGCl) and 1-triacetoxysilanyl-3-[2-(3-triacetoxysilanyl-propoxy)-ethoxy]propane (EGOAc)

Scheme 1 below depicts an exemplary synthetic route for the preparation of 1-trichlorosilanyl-3-[2-(3-trichlorosilanyl-propoxy)-ethoxy]-propane (EGCl) and 1-triacetoxysilanyl-3-[2-(3-triacetoxysilanyl-propoxy)-ethoxy]-propane (EGOAc).

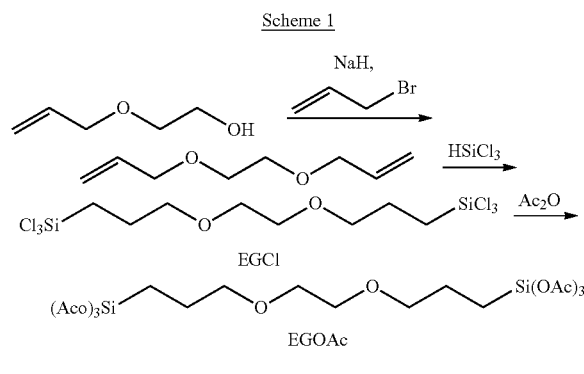

Scheme 1

Step 1: Preparation of 3-(2-allyloxy-ethoxy)-propene

Sodium hydride (NaH, 5.0 g, 0.208 mol) was slowly added to a solution of 2-allyloxy-ethanol (20 mL, 0.187 mol) while stirring. Allyl bromide (32 mL, 0.370 mol) was added and the mixture was stirred at 60° C. for 10 hours. After cooling, the reaction mixture was filtered and a dark oil was obtained after solvent evaporation. The oil was fractionally distilled to give 22 grams of 3-(2-allyloxy-ethoxy)-propene (0.155 mol, yield 83%) as a colorless oil. $^1$H NMR (400 Mz, CDCl$_3$): δ 3.6 (t, 2H), 4.0 (d, 2H), 5.1 (d 1H), 5.3 (d 1H), 5.9 (q, 1H).

Step 2: Preparation of 1-trichlorosilanyl-3-[2-(3-trichlorosilanyl-propoxy)-ethoxy]-propane (EGCl)

3-(2-Allyloxy-ethoxy)-propene (20 g, 0.141 mol) and 40 mg of hydrogen hexachloroplatinate (IV) hydrate were added to a 250-mL air-free flask with a condenser. Trichlorosilane (40 mL, 0.396 mol) was added dropwise to the stirred solution which was subsequently heated in an oil bath of 80° C. The reaction mixture was heated at reflux for 4 hours and then distilled in vacuum. The fraction containing di(3-trichlorosilyl)propyl ethylene ether (39 g, 0.0944 mol) at 90° C. and 20 mtorr was collected with a yield of 70% based on 3-(2-allyloxy-ethoxy)-propene. $^1$H NMR (400 Mz, CDCl$_3$): δ 1.5 (t, 2H), 1.8 (m, 2H), 3.4 (t, 2H), 3.6 (t, 2H). $^{29}$Si NMR (79.6 Mz, CDCl$_3$): 13.4 (s).

Step 3: Preparation of 1-triacetoxysilanyl-3-[2-(3-triacetoxysilanyl-propoxy)-ethoxy]-propane (EGOAc)

Di(3-trichlorosilyl)propyl ethylene ether (10 g, 0.0242 mol) and acetic anhydride (27 mL, 0.048 mol) were slowly added to a 100 mL air-free flask. The reaction solution was stirred at 80° C. for 5 hours. Acetyl chloride was removed by distillation occasionally during the reaction. After all the volatiles were removed (120° C. at 5 mtorr), 13.4 g (0.0241 mol) of di(3-triacetoxysilyl)propyl ethylene ether (EGOAc) were obtained with a yield of 99.6%. $^1$H NMR (400 Mz, CDCl$_3$): δ 1.1 (t, 2H), 1.7 (m, 2H), 2.0 (s, 9H), 3.3 (t, 2H), 3.5 (t, 2H). $^{29}$Si NMR (79.6 Mz, CDCl$_3$): −44.9 (s). Anal. Calcd for C$_{20}$H$_{34}$O$_{14}$Si2: C, 43.31; H, 6.18. Found: C, 42.79; H, 6.16.

EXAMPLE 2

Preparation of 1,6-bis(tri(dimethylamino)silyl)hexane (C$_6$NMe$_2$)

A solution of 1,6-bis(trichlorosilyl)hexane (2 mL, 7.518 mmol) in 25 mL of tetrahydrofuran (THF) was placed in a 100 mL air-free flask under nitrogen atmosphere. The solution was then cooled in an ice bath and a solution of dimethylamine (2M, 90.2 mmol) in 50 mL of THF was added dropwise while stirring. After the addition of dimethylamine, the mixture was allowed to slowly warm up to 50° C., kept overnight then filtered with an air-free grit. The solvent was removed under vacuum and 3.0 g of 1,6-bis(tri(dimethylamino)silyl)hexane was obtained with a yield of 98%. $^1$H NMR (400 Mz, CDCl$_3$): δ 0.65 (t, 4H), 1.35 (m, 8H), 2.42 (s, 36H). $^{29}$Si NMR (79.6 Mz, CDCl$_3$): −16.6 (s). Anal. Calcd for C$_{18}$H$_{48}$N$_6$Si$_2$: C, 53.41; H, 11.95; N, 20.76. Found: C, 51.07; H, 11.39; N, 18.11.

EXAMPLE 3

Preparation of 1,6-bis(trichlorosilyl)-3,3,4,4-tetrafluorohexane (F$_4$C$_6$Cl) and 1,6-bis(triacetoxysilyl)-3,3,4,4-tetrafluorohexane (F$_4$C$_6$OAc)

Scheme 2 below depicts an exemplary synthetic route for the preparation of 1,6-bis(trichlorosilyl)-3,3,4,4-tetrafluorohexane (F$_4$C$_6$Cl) and 1,6-bis(triacetoxysilyl)-3,3,4,4-tetrafluorohexane (F$_4$C$_6$OAc).

Scheme 2

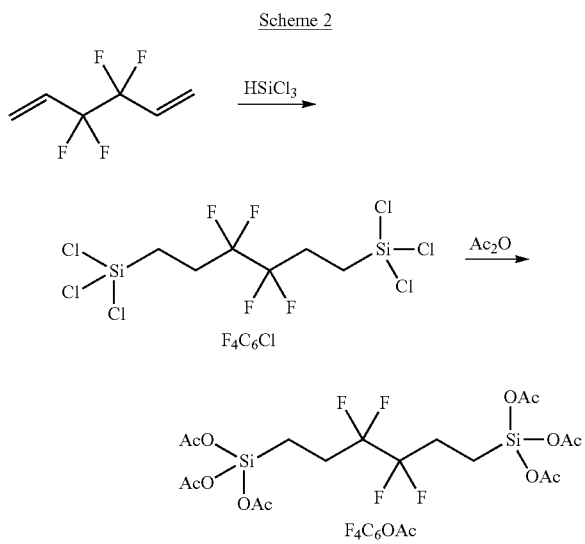

Step 1: Preparation of
1,6-bis(trichlorosilyl)-3,3,4,4-tetrafluorohexane
($F_4C_6Cl$)

1,2-Diethenyltetrafluoroethane (1 g, 6.5 mmol) and 4 mg of hydrogen hexachloroplatinate (IV) hydrate were dissolved in dried $CH_2Cl_2$ (15 mL). Trichlorosilane (10 mL, 9.9 mmol) was added dropwise to the stirred solution. The reaction mixture was heated at 40° C. overnight, followed by removal of excess $HSiCl_3$ and solvent by vacuum evaporation. The crude product was recovered in a yield of greater than about 96% (2.6 g). $^1$H NMR (400 Mz, $CDCl_3$): δ 2.4 (m, 4H), 1.4 (m, 4H). $^{29}$Si NMR ($CDCl_3$): 14.1 (s). $^{19}$F NMR ($CDCl_3$): −115.1 (t, J=12 Hz, 4F).

Step 2: Preparation of
1,6-bis(triacetoxysilyl)-3,3,4,4-tetrafluorohexane
($F_4C_6OAc$)

1,6-Bis(trichlorosilyl)-3,3,4,4-tetrafluorohexane (1 g, 2.35 mmol) and acetic anhydride (4 mL) were added to a 10 mL air-free flask. The reaction solution was stirred at 80° C. for 5 hours. After all the volatiles were removed (120° C. at 5 mtorr), 1.24 g (2.20 mol) of the product were obtained with a yield of 99.6%. $^1$H NMR (400 Mz, $CDCl_3$): δ 2.4 (m, 4H), 1.3 (m, 4H). $^{29}$Si NMR (79.6 Mz, $CDCl_3$): −45.3 (s). $^{19}$F NMR ($CDCl_3$): −114.6 (t, J=13 Hz, 4F).

EXAMPLE 4

Preparation of
poly[4-methoxystyrene-co-4-(3-triacetoxysilyl propoxystyrene)]

Scheme 3 below depicts an exemplary synthetic route for the preparation of poly[4-methoxystyrene-co-4-(3-triacetoxysilylpropoxystyrene)].

Scheme 3

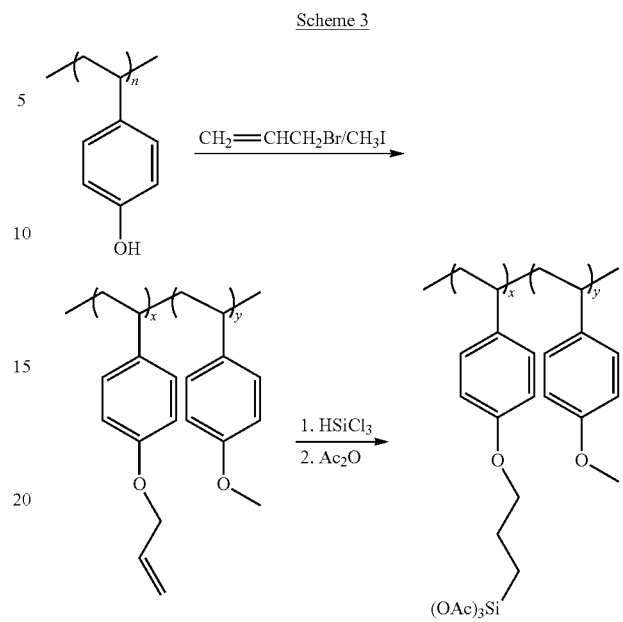

Step 1: Preparation of
poly[4-methoxystyrene-co-4-allyloxystyrene]

Poly(4-vinyl phenol) (1.0 g, Mw=8,000 g/mol or 20,000 g/mol) was dissolved in 30 mL of dried THF, followed by the addition of 6.7 g of sodium carbonate, 0.25 mL (4.2 mmol) of iodomethane and 6 mL (69 mmol) of allyl bromide. The reaction mixture was heated at reflux in an oil bath of 70° C. for 24 hours and subsequently slowly poured into 500 mL of deionized water. The precipitated viscous solid was dried in vacuum. Based on $^1$H NMR spectra, the composition of the resulting poly[4-methoxystyrene-co-4-allyloxystyrene] was determined to be 10:90 (mol. %) 4-methoxystyrene:4-allyloxystyrene. $^1$H NMR (400 Mz, $CDCl_3$): δ 1.1-2.5 (b), 3.7 (s), 4.5 (d), 5.2 (d), 5.4 (d), 5.9 (d), 6.2-7.3 (b).

Step 2: Preparation of
poly[4-methoxystyrene-co-4-(3-triacetoxysilyl propoxystyrene)]

Poly(4-methoxystyrene-co-4-allyloxystyrene) from Step 1 (1.0 gram), 3 mg of hydrogen hexachloroplatinate (IV) hydrate, and 30 mL dried THF were added to a 250-mL air-free flask with a condenser. Trichlorosilane (2 mL, 0.0198 mol) was added dropwise to the solution and the solution was subsequently heated in an oil bath of 80° C. The reaction mixture was heated at reflux for 4 hours, followed by filtration and condensation of the filtrate. The resulting yellowish viscous solid (1.9 g) was dissolved in 20 mL of dried THF. Distilled acetic anhydride (5 mL) was added to the solution which was subsequently heated to 80° C. for 10 hours. After all the volatile fractions had been removed by distillation at 120° C. and 5 mtorr, 1.9 g of the viscous residue poly[4-methoxystyrene-co-4-(3-triacetoxysilylpropoxystyrene)] was obtained. $^1$H NMR (400 Mz, $CDCl_3$): δ 0.9 (t), 1.1-2.0 (b), 2.0 (b), 3.5 (s), 3.7 (t), 6.2-7.0 (b).

EXAMPLE 5

Preparation of poly(vinylphenol-co-4-cinnamoylstyrene)

Scheme 4 below depicts an exemplary synthetic route for the preparation of poly(vinylphenol-co-4-cinnamoylstyrene).

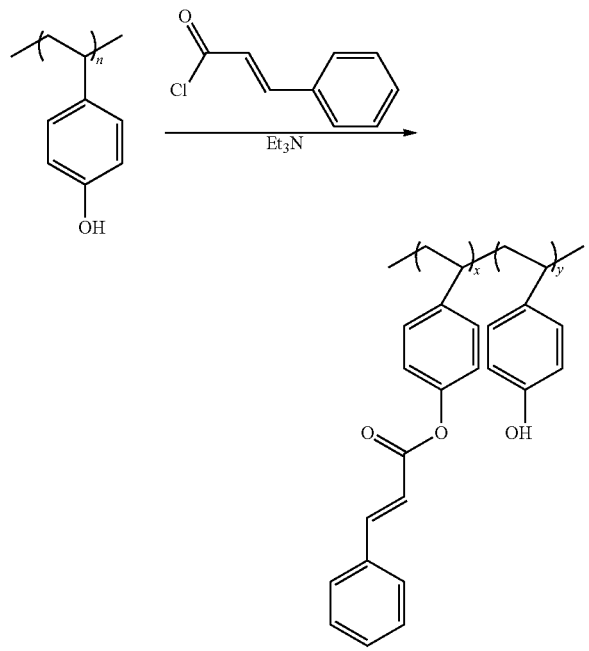

Scheme 4

Poly(4-vinylphenol) (1.0 g, Mw=8,000 g/mol or 20,000 g/mol, hydroxyl group: 8.33 mmol) was dissolved in 20 mL of THF. Cinnamoyl chloride (0.70 g, 4.2 mmol) and triethylamine (1.0 mL, 8.33 mmol) were slowly added to the solution which was subsequently heated to 50° C. for 4 hours. The reaction mixture was poured into 500 mL of deionized water. The precipitated solid was filtered, washed with 100 mL of methanol three times and dried in vacuum. $^1$H NMR verified 50% cinnamation of the poly(vinylphenol). $^1$H NMR (400 Mz, CDCl$_3$): δ 1.1-2.6 (b), 6.4 (d), 6.5-7.6 (b), 7.7 (d).

EXAMPLE 6

Surface Morphology and Dielectric Properties of Spin-Coated Ultrathin Dielectric Films Prepared from Precursor Compositions Containing Bifunctionalized-Silane Crosslinkers To assess how the surface morphology and various dielectric characteristics of a CPB dielectric film can be affected by the choice of the polymeric component and the crosslinker component of the precursor composition, precursor compositions were prepared from different combinations of various polymers, thermally curable crosslinkers, and solvents. These precursor compositions were subsequently spin-coated onto silicon substrates to provide ultrathin (<50 nm) dielectric films.

The following polymers were used:

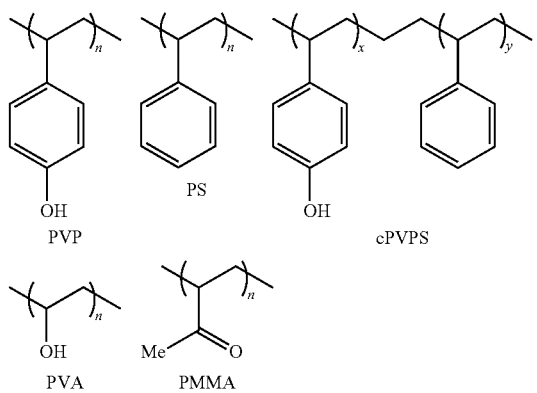

Poly(4-vinyl phenol) (PVP, M$_w$=8-20K), poly(styrene) (PS, M$_w$=1M), poly(vinyl alcohol) (PVA), and poly(methylmethacrylate) (PMMA) were purchased from Sigma-Aldrich (St. Louis, Mo.) and used without further purification. Poly (4-vinyl phenol-co-styrene) [P(VP$_x$—S$_y$)] was synthesized according to the procedures described in Lei et al. (2003), *Macromolecules*, 23: 5071-5074.

The following crosslinkers (cxn) were used:

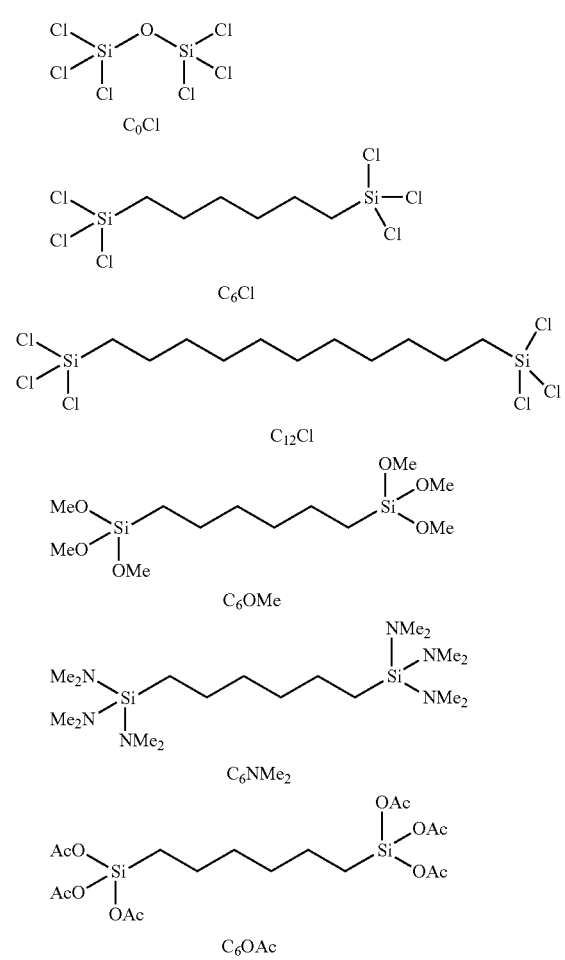

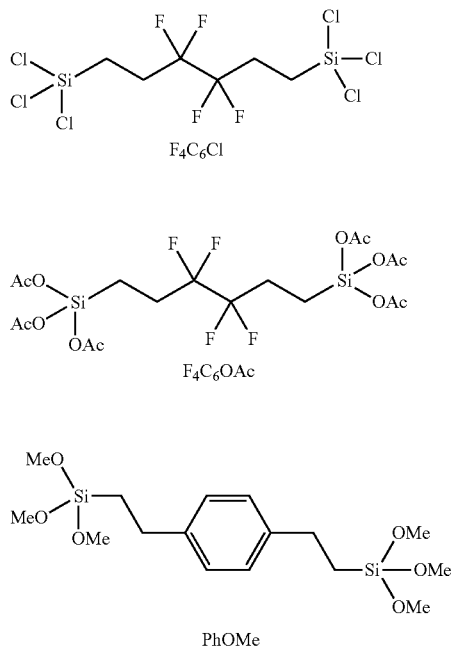

Hexachlorodisiloxane ($C_od$) and 1,6-bis(trichlorosilyl)hexane ($C_6Cl$) were purchased from Acros Organics (Geel, Belgium) and Gelest, Inc. (Morrisville, Pa.), respectively, and purified by distillation. 1,12-Bis(trichlorosilyl)dodecane ($C_{12}Cl$) was synthesized by hydrosilylation of commercially available 1,11-dodecadiene. 1,6-Bis(trimethoxysilyl)hexane ($C_6OMe$) and 1,6-bis(triacetoxysilyl)hexane ($C_6OAc$) were synthesized from the chloro precursors $C_6Cl$. 1,4-Bis(trimethoxysilylethyl)benzene (PhOMe) was synthesized according to procedures described in Kabeta et al., *J. Polym. Sci. A. Polym. Chem.*, 34(14): 2991-2998 (1996). 1,6-Bis(tri(dimethylamino)silyl)hexane ($C_6NMe_2$), 1,6-bis(trichlorosilyl)-3,3,4,4-tetrafluorohexane ($F_4C_6Cl$), and 1,6-bis(triacethoxysilyl)-3,3,4,4-tetrafluorohexane ($F_4C_6OAc$) were prepared as described in Examples 2 and 3.

The solvents used were tetrahydrofuran (THF), dioxane, and ethyl acetate (AcOEt).

The silicon substrates were highly n-doped silicon wafers obtained from Montco Silicon Tech, Inc. (Spring City, Pa.) and cleaned according to standard procedures, e.g., sonication in organic solvent, Pirahna solution, and oxygen plasma treatment, before use.

To prepare the precursor composition, solutions of the polymer and the crosslinker were prepared with the selected solvent and the solutions combined in a specific volume ratio. The precursor composition was then spin-coated onto freshly oxygen plasma-treated silicon substrates. The thickness of the film samples was partially controlled by adjusting the spin coating rate between about 1500 rpm and about 5000 rpm (acceleration 60). After the spin-coating step, the resulting dielectric films were annealed (thermally cured) in a high humidity atmosphere (70-90%) at about 100° C. to about 130° C. for 5-10 minutes and then for 1-3 hours in a vacuum oven (dry curing) at the same temperature. Film thickness and surface smoothness (represented by root mean square (RMS)) were determined by profilometry and AFM. MIS capacitor structures were fabricated using the resulting dielectric films, and the capacitance of the dielectric films was measured. The results are summarized in Table 1 below.

TABLE 1

| Entry | Polymer | Crosslinker | Solvent | Ratio Polymer:Cxn | Thickness (nm) | RMS (nm) | $C_i$ (nF cm$^{-2}$) |
|---|---|---|---|---|---|---|---|
| 1 | PVP | $C_0Cl$ | THF | 4:4 | 18-40 | 6-8 | 150-305 |
| 2 | PVP | $C_6Cl$ | THF | 4:4 | 18-40 | 1-3 | 150-300 |
| 3 | PVP | $C_{12}Cl$ | THF | 4:4 | 20-40 | 4-6 | 150-290 |
| 4 | PVP | $C_6OMe$ | Dioxane | 4:8 | 17-40 | 0.5-1 | 160-250 |
| 5 | PVP | PhOMe | Dioxane | 4:8 | 18-40 | 0.5-1 | 170-320 |
| 6 | PVP | $C_6OAc$ | AcOEt | 4:8 | 17-40 | 0.4-0.5 | 150-250 |
| 7 | PVP | $C_6OAc$ | AcOEt | 4:6 | 13-35 | 0.2-0.3 | 160-300 |
| 8 | PVP | $C_6OAc$ | AcOEt | 4:4 | 12-25 | 0.2-0.3 | 170-325 |
| 9 | PVP | $C_6OAc$ | AcOEt | 4:2 | 10-20 | 0.2-0.3 | 180-340 |
| 10 | PVP | $C_6NMe_2$ | AcOEt | 4:6 | 15-25 | 0.5-0.9 | 170-320 |
| 11 | PVP | $F_4C_6Cl$ | AcOEt | 4:4 | 13-20 | 0.4-0.5 | 180-350 |
| 12 | PVP | $F_4C_6OAc$ | AcOEt | 4:4 | 12-18 | 0.2-0.3 | 200-360 |
| 13 | PS | $C_0Cl$ | THF | 4:4 | 12-25 | 8-10 | 120-220 |
| 14 | PS | $C_6Cl$ | THF | 4:4 | 10-20 | 1-2 | 120-220 |
| 15 | PS | $C_{12}Cl$ | THF | 4:4 | 13-30 | 4-5 | 100-200 |
| 16 | cPVPS | $C_6OAc$ | Dioxane | 4:4 | 22-45 | 0.5-1 | 130-280 |
| 17 | PVA | $C_6OAc$ | Dioxane | 4:4 | 10-20 | 0.5-2 | 400-600 |
| 18 | PMMA | $C_6OAc$ | Dioxane | 4:4 | 19-40 | 1-2 | 160-320 |

EXAMPLE 7

Figure 3:
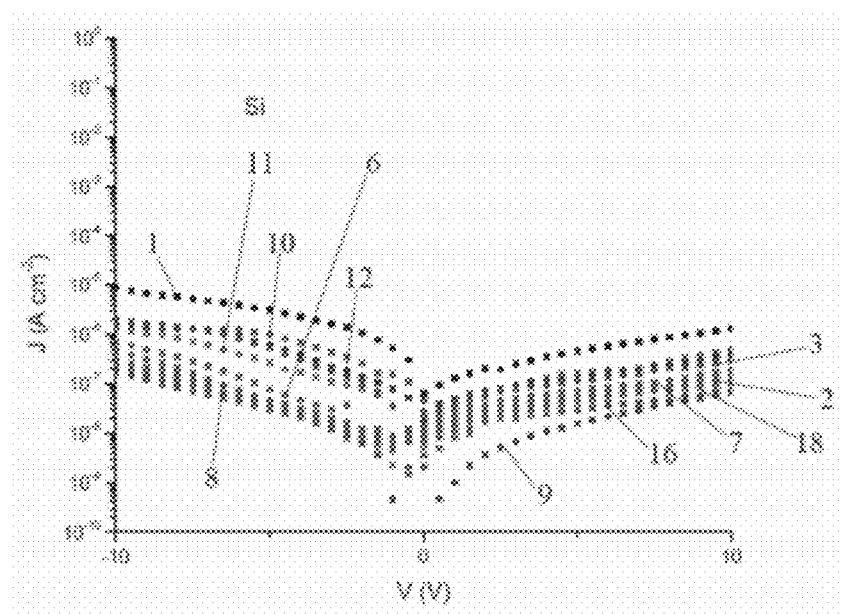
FIG. 3 shows representative leakage current plots for several embodiments of dielectric films of the present teachings. Specifically, the films have a thickness between about 40 nm and 50 nm and were fabricated on doped silicon (Si) substrates using the polymer-crosslinker ratios listed in Table 1.

Insulating Properties of Spin-Coated Ultrathin Dielectric Films Prepared from Precursor Compositions Containing Bifunctionalized-Silane Crosslinkers All of the dielectric films prepared in Example 6 exhibit very low leakage currents, ranging between $10^{-6}$ and $10^{-7}$ $A/cm^2$ at 2-4 MV/cm. Representative leakage current-voltage plots are shown in FIG. 3.

Figure 4:
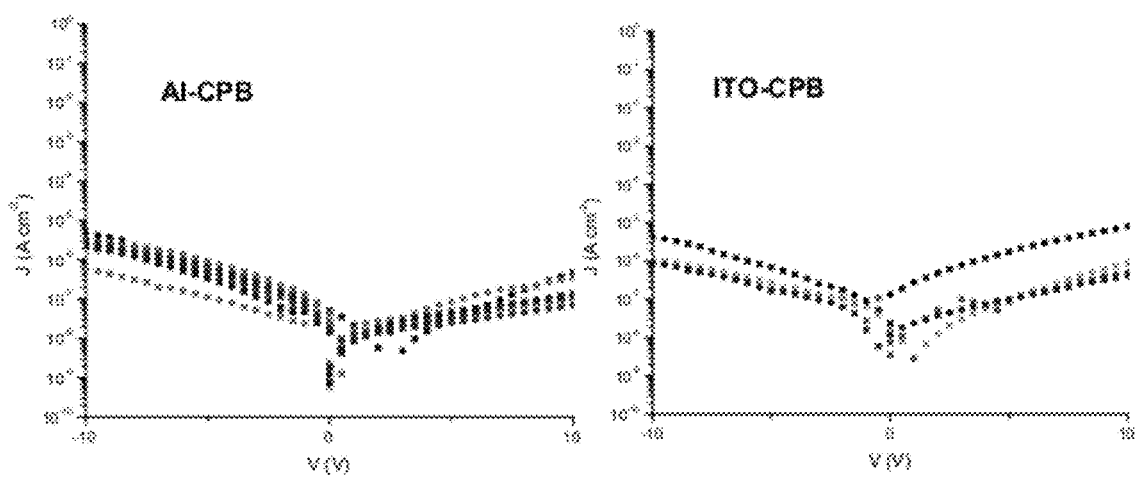
FIG. 4 shows representative leakage current plots for the same embodiments of dielectric films as FIG. 3, except that they were fabricated on aluminium-polyethylene naphthalate (Al-PEN) and indium tin oxide (ITO)-glass substrates.

Comparable leakage current densities were obtained using other gate substrates, specifically, Al-PEN and ITO-glass substrates. Al-PEN substrates were prepared according to literature reports; e.g., by sputtering aluminum (about 20-100 nm in thickness) on an $O_2$-plasma treated commercially-available PEN substrate. ITO-glass substrates were cleaned with an oxygen plasma before use. Representative leakage current-voltage plots are provided in FIG. 4.

EXAMPLE 8

Surface Morphology and Dielectric Characteristics of Spin-Coated Dielectric Films Prepared from Precursor Compositions Containing Bifunctionalized-Silane Ethylene Glycol Crosslinkers Spin-coated dielectric films were prepared using thermally curable precursor compositions containing bifunctionalized triacetoxylated-silane ethylene glycol crosslinkers (EGOAc) following procedures described in Examples 1 and 6. The compositions of the precursor compositions were summarized in Table 2, along with the thickness and the capacitance values of the resulting dielectric films and the substrate used. Both ultrathin (<50 nm) and thin dielectric films (about 50-400 nm) were prepared.

TABLE 2

| Entry | Gate | Ratio PVP:EGOAc | Thickness (nm) | $C_i$ (nF cm-2) |
|---|---|---|---|---|
| 1 | Si | 80:80 | 325 | 15.25 |
| 2 | Si | 60:60 | 220 | 21.0 |
| 3 | Si | 40:40 | 145 | 29.5 |
| 4 | Si | 30:30 | 80 | 52.7 |
| 5 | Si | 20:20 | 40 | 85.0 |
| 6 | Al | 80:80 | 320-330 | 16.25 |
| 7 | Al | 60:60 | 210-230 | 22.5 |
| 8 | Al | 40:40 | 140-150 | 36.0 |
| 9 | Al | 30:30 | 80 | 55.75 |
| 10 | Al | 20:20 | 40 | 80.75 |
| 11 | ITO | 80:80 | 320-330 | 18.5 |
| 12 | ITO | 60:60 | 210-230 | 23.0 |
| 13 | ITO | 40:40 | 140-150 | 38.5 |
| 14 | ITO | 30:30 | 80 | 56.0 |
| 15 | ITO | 20:20 | 40 | 82.7 |

Dielectric films prepared with bifunctionalized-silane ethylene glycol crosslinkers exhibited excellent surface smoothness, with an RMS roughness of about 0.3 nm to about 0.7 nm.

EXAMPLE 9

Figure 5:
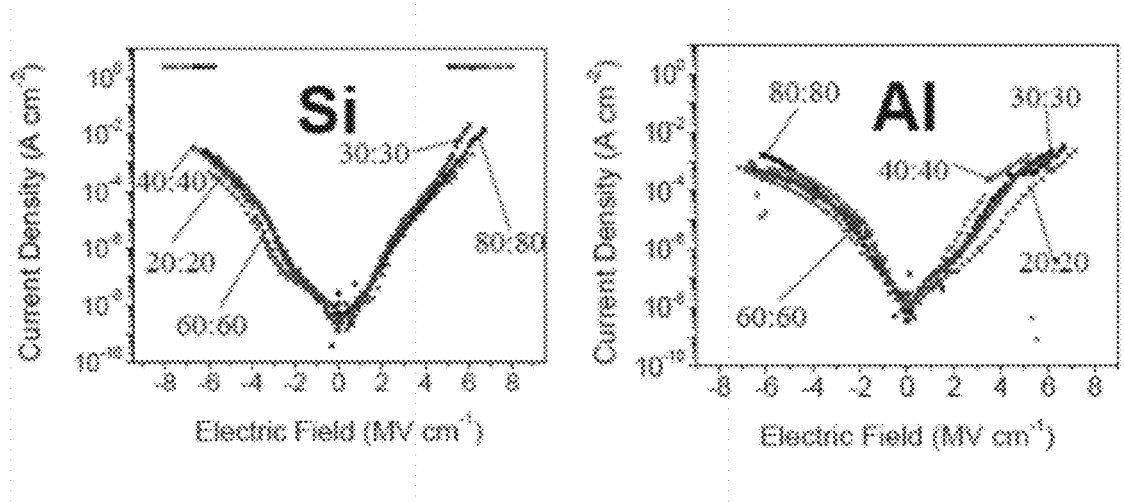
FIG. 5 shows current-voltage (I-V) plots for several embodiments of dielectric films of the present teachings fabricated in capacitor structures.

Insulating Properties of Spin-Coated Dielectric Films Prepared from Precursor Compositions Containing Bifunctionalized-Silane Ethylene Glycol Crosslinkers The dielectric films from Example 8 were used to fabricate capacitor structures and were found to exhibit very large dielectric strength as demonstrated by the current-voltage plots shown in FIG. 5.

EXAMPLE 10

Device Performance of OFETs Fabricated with Spin-Coated Dielectric Films Prepared from Precursor Compositions Containing Bifunctionalized-Silane Ethylene Glycol Crosslinkers Pentacene OFETs were fabricated with dielectric films of Example 8 on both silicon and aluminium gate materials. Specifically, the silicon substrates were highly n-doped silicon wafers obtained from Montco Silicon Tech, Inc. (Spring City, Pa.) and cleaned according to standard procedures, e.g., sonication in organic solvent, Pirahna solution, and oxygen plasma treatment, before use. The aluminium substrates were cut from commercially available aluminium foil (Reynolds Wrap®). Pentacene was purchased from Sigma-Aldrich (St. Louis, Mo.) and vacuum-deposited at about $2 \times 10^{-6}$ Torr (500 Å, 0.2 Å/s) while maintaining the substrate temperature at about 50° C. to about 70° C. Gold electrodes were vacuum-deposited through shadow masks at $3-4 \times 10^{-6}$ Torr (1000 Å, 0.5 Å/s). The channel length is 100 µm, and the channel width is 2000 µm.

Figure 6:
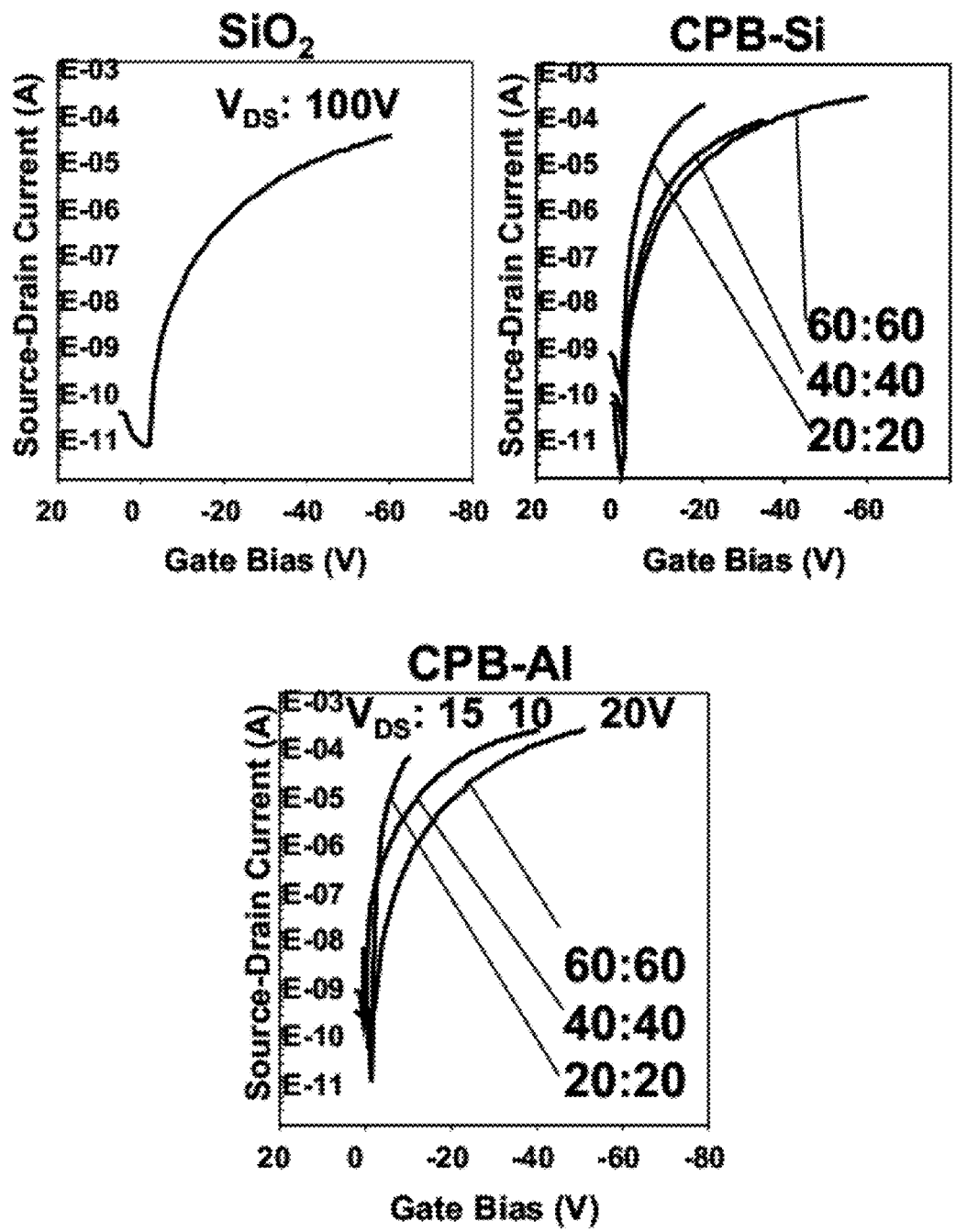
FIG. 6 shows the transfer plots of several embodiments of OFETs of the present teachings (the present dielectric material on a silicon substrate (CPB-Si) and the present dielectric material on an aluminum substrate (CPB-Al)) and a comparative OFET having $SiO_2$ as the dielectric material.

These OFETs were found to perform very well at variable operating voltages, indicating a high capacitance of the dielectric materials. Representative OFET transfer plots are shown in FIG. 6. The use of thinner dielectric films (20:20) compared to thicker ones (e.g., 60:60) were shown to achieve similar output current. However, the thinner films allowed much lower operating voltages due to their higher capacitance (see Eq. 2). The carrier mobilities of these devices are about 0.5 $cm^2/Vs$ to about 3 $cm^2/Vs$, which are typical for pentacene films grown at 50° C. Current modulations ($I_{on}:I_{off}$ ratios) were measured to be >$10^6$.

A comparative pentacene OFET device was fabricated using silicon oxide ($SiO_2$) as the dielectric material. The silicon oxide film has a thickness of 300 nm. The carrier mobilities of this comparative device was found to be about 0.1 $cm^2/Vs$ to about 0.3 $cm^2/Vs$ at larger operating voltages.

EXAMPLE 11

Surface Morphology and Dielectric Properties of Spin-Coated Thin Dielectric Films Prepared from Precursor Compositions Containing Bifunctionalized-Silane Crosslinkers Thin dielectric films (about 50-300 nm) were prepared using precursor compositions employing PVP as the polymer and $C_6Cl$, $C_6OAc$, EGOAc, $C_6NMe_2$ and $F_4C_6Cl$, respectively as the crosslinker component. The precursor compositions were spin-coated on Si and flexible Al/PEN substrates following procedures described in Example 6. Table 3 summarizes the compositions of the precursor compositions, as well as the electrical and physical properties of the resulting dielectric films on Si substrates.

TABLE 3

| Entry | Polymer | Crosslinker | Solvent | Ratio Polymer:Cxn | Thickness (nm) | RMS (nm) | $C_i$ (nF cm$^{-2}$) |
|---|---|---|---|---|---|---|---|
| 1 | PVP | $C_6Cl$ | THF | 40:40 | 155 | 0.3-0.4 | 32 |
| 2 | PVP | $C_6OAc$ | Dioxane | 20:20 | 50 | 0.2-0.3 | 91 |
| 3 | PVP | $C_6OAc$ | Dioxane | 40:40 | 130 | 0.2-0.3 | 33 |
| 4 | PVP | $C_6OAc$ | Dioxane | 60:60 | 205 | 0.2-0.3 | 22 |
| 5 | PVP | $C_6OAc$ | Dioxane | 80:80 | 305 | 0.2-0.3 | 12 |
| 6 | PVP | $C_6NMe_2$ | AcOEt | 40:40 | 90 | 2-3 | 56 |
| 7 | PVP | $F_4C_6Cl$ | AcOEt | 40:40 | 115 | 0.6-0.9 | 47 |

Figure 7:
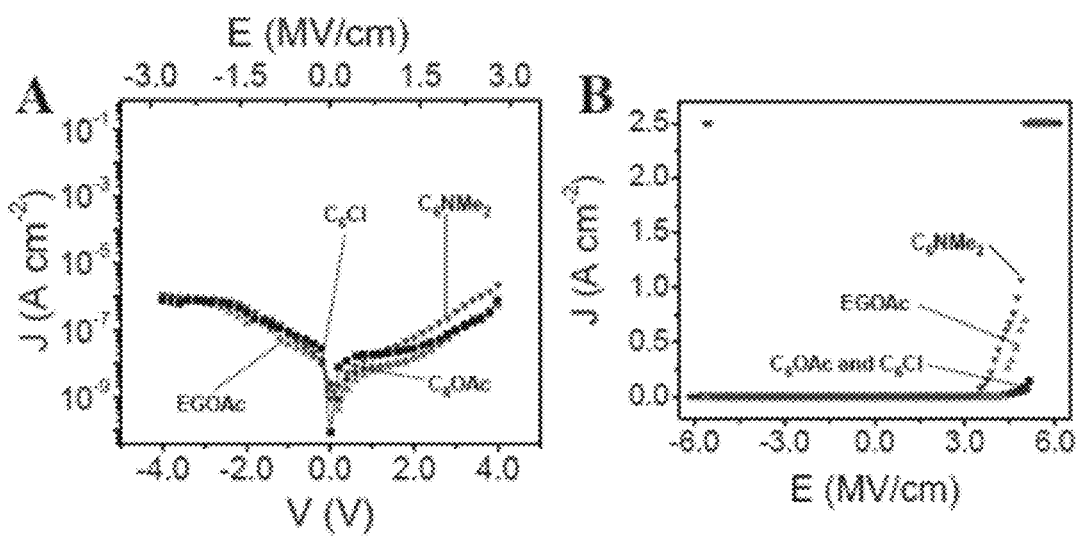
FIG. 7 shows leakage current density vs voltage (J-V) plots (A) and leakage current density vs electric field (J-E) plots for thin dielectric films according to the present teachings prepared from precursor compositions including PVP and one of the following crosslinkers: $C_6Cl$, $C_6OAc$, EGOAc, and $C_6NMe_2$.

Thin dielectric films fabricated with crosslinkers $C_6Cl$ and $C_6NMe_2$ afford ~10 times higher leakage current densities (~1×10$^{-6}$ A/cm$^2$) compared to those fabricated with EGOAc and $F_4C_6Cl$ (~1×10$^{-7}$ A/cm$^2$) at an electric field of 2 MV/cm. EGOAc-based dielectric films also afford smoother film morphology (RMS~0.2-0.3 nm) than $C_6Cl$-based (~0.3-0.4 nm) or $C_6NMe_2$-based (~2-3 nm) films. While dielectric films fabricated with $C_6Cl$ show relatively smooth film morphology at a small area, the overall film morphology is not as smooth as EGOAc-based films. Compared to films fabricated on Si substrates, dielectric films fabricated on Al/PEN substrates afford relatively rough surface morphologies (RMS~0.5-0.6 nm) and higher leakage current densities (~1× 10$^{-6}$ A/cm$^2$) at an electric field of 2 MV/cm. Representative leakage current-voltage plots are shown in FIG. 7.

EXAMPLE 12

Fabrication and Performance of Thin Film Transistors Using Ultra-Thin And Thin Spin-Coated Dielectric Films Top-contact OFETs were fabricated with ultra-thin (<50 nm) and thin (about 50-300 nm) spin-coated dielectric films prepared with PVP and a crosslinker selected from $C_6Cl$, $C_6OAc$, EGOAc, $C_6NMe_2$ and $F_4C_6Cl$. Si and Al/PEN substrates were used, along with pentacene (P5) and 5,5'''-diperfluorohexylcarbonyl-2,2':5',2":5",2'''-quaterthiophene (DFHCO-4T) as the p-type and n-type semiconductor, respectively. P5 was purchased from Sigma-Aldrich (St. Louis, Mo.) and vacuum-deposited at about 2×10$^{-6}$ Torr (500 Å, 0.2 Å/s) while maintaining the substrate temperature at about 50° C. to about 70° C. DFHCO-4T were prepared and deposited as described in U.S. Patent Application Publication No. 2006/0186401, the disclosure of which is incorporated by reference in its entirety. Gold electrodes were vacuum-deposited through shadow masks at 3–4×10$^{-6}$ Torr (1000 Å, 0.5 Å/s). The channel length is 100 μm, and the channel width is 2000 μm.

Figure 8:
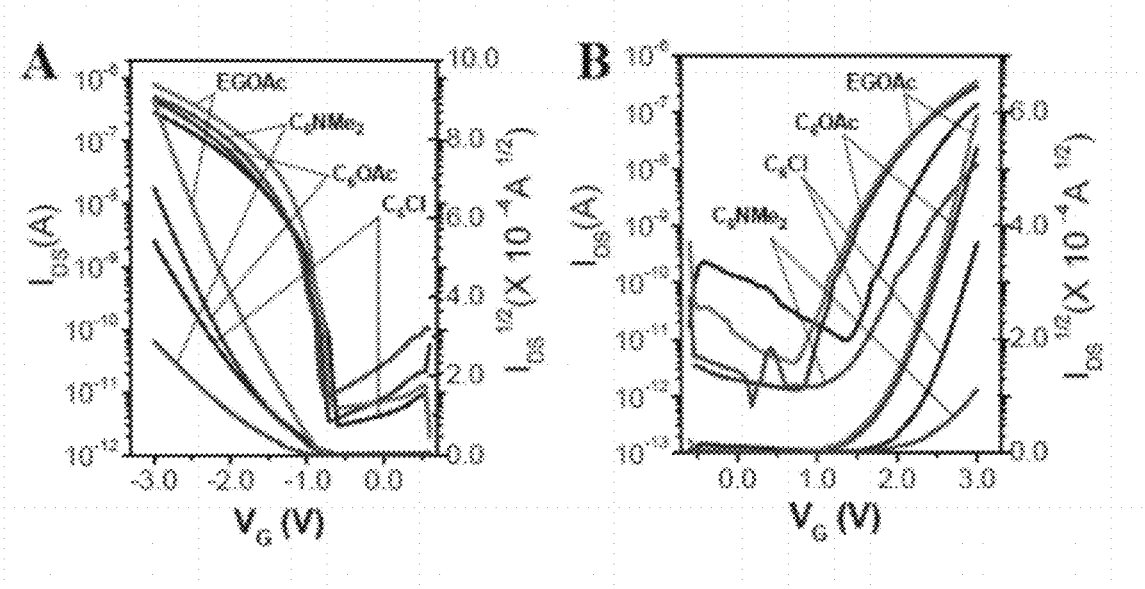
FIG. 8 shows the transfer plots of several embodiments of OFETs of the present teachings. The OFETs were fabricated with an ultra-thin dielectric film prepared from a precursor composition that includes PVP and one of the following crosslinkers: $C_6CL$, $C_6OAc$, EGOAc, and $C_6NMe_2$, and either a pentacene semiconductor layer (A) or a DFHCO-4T semiconductor layer (B).

Transfer characteristics of the devices were measured in the saturation regime and transfer plots for 50-nm thick film FETs are shown in FIG. 8. Table 4 summarizes the OFET performance parameters, carrier mobility ($\mu_{sat}$) and current on/off ratio ($I_{on}:I_{off}$). The charge carrier mobility shows strong correlation with the thickness of the dielectric films. Thin (<50 nm) dielectric films show relatively low mobility of 0.02-0.16 cm$^2$/Vs for both P5 and DFHCO-4T devices, compared to thicker films (~50-300 nm) fabricated with EGOAc (~0.30-0.50 cm$^2$/Vs). For all dielectric films, $I_{on}:I_{off}$ shows comparable values between ~10$^5$-10$^6$.

TABLE 4

| | | P5 | | DFHCO-4T | |
|---|---|---|---|---|---|
| Crosslinker | Ratio | $\mu_{sat}{}^a$ | $I_{on}/I_{off}$ | $\mu_{sat}$ | $I_{on}/I_{off}$ |
| $C_6Cl$ | 6:6 | 0.07 | 10$^5$ | 0.12 | 10$^5$ |
| $C_6OAc$ | 4:6 | 0.12 | 10$^5$ | 0.12 | 10$^5$ |
| | 4:6 | 0.15 | 10$^5$ | 0.16 | 10$^6$ |
| | 20:20 | 0.40 | 10$^5$ | 0.44 | 10$^6$ |
| EGOAc | 40:40 | 0.31 | 10$^6$ | 0.43 | 10$^6$ |
| | 60:60 | 0.38 | 10$^6$ | 0.47 | 10$^5$ |
| | 80:80 | 0.47 | 10$^6$ | 0.52 | 10$^5$ |
| $C_6NMe_2$ | 4:6 | 0.03 | 10$^5$ | 0.02 | 10$^5$ |
| $F4C_6Cl$ | 4:4 | 0.04 | 10$^5$ | 0.09 | 10$^5$ |

$^a$Calculated for the charge carrier concentration ($n_Q = C_i \cdot V_G/e = 5\text{-}6 \times 10^{12}$ cm$^{-2}$).

The trend in mobility values is consistent with the aforementioned dielectric film morphologies. For thin dielectric films, the P5 FET device fabricated with EGOAc, with the smoothest film morphology, afford the highest carrier mobility of 0.15 cm$^2$/Vs among all crosslinkers, followed by $C_6OAc$ (0.12 cm$^2$/Vs), $C_6Cl$ (0.07 cm$^2$/Vs), $F_4C_6Cl$ (0.04 cm$^2$/Vs), and $C_6NMe_2$ (0.03 cm$^2$/Vs). Similar trend in charge carrier mobility for n-type semiconductor DFHCO-4T was observed. Because charge transport in OTFT is confined to the small region at the semiconductor/dielectric interface, the smoothness of the dielectric film is a prerequisite for improved OTFT performance. It has been reported with pentacene film FETs that rough gate dielectric surfaces afford smaller pentacene grains compared to very smooth substrates, leading to poorer FET performance. Grain boundaries between semiconductor crystallites are considered to be one type of interfacial charge trapping sites, which disrupt charge transport. Pentacene films grown on relatively smooth dielectric films fabricated with $C_6OAc$ and EGOAc afford large, dendritic grains (>3 μm), while very small (<0.3 μm) pentacene grains are grown on $C_6Cl$-based and $C_6NMe_2$-based dielectric films.

EXAMPLE 13

Printability of Dielectric Precursor Compositions Containing Thermally Curable Bifunctionalized-Silane Ethylene Glycol Crosslinkers Using acetoxy-bisfunctionalized crosslinkers such as $C_6OAc$ from Example 6 and EGOAc from Example 8, printable dielectric materials were fabricated. Experiments were performed to identify the best printing solvent for a certain polymer-crosslinker precursor composition. For instance, in the case of PVP and $C_6OAc$ or EGOAc, the solvents tested are shown in Table 5 below. The experiments were performed using an IGT Reprotest F1 printing press (IGT, Amsterdam, Netherlands) in gravure mode with the following parameters: Anilox force 100 N, printing speed 0.4 m/s, anilox cylinder 402.206 (copper engraved-chromium plated, stylus 120°, screen angle 45, volume 7.5 mL/m²). Similar to the procedures described in Example 6, the polymer and the crosslinker were individually dissolved in solvent and combined at a specific volume ratio. The resulting formulation was gravure-printed (also can be flexo printed) onto freshly oxygen plasma-treated ITO-mylar or Al—PEN substrates.

TABLE 5

| Entry | PVP (mg) | Crosslinker (mg) | Solvent (0.4 mL) | Quality |
|---|---|---|---|---|
| | | $C_6OAc$ | | |
| 1 | 100 | 50 | THF | Good |
| 2 | 100 | 50 | Dioxane | Poor |
| 3 | 100 | 50 | AcOEt | Excellent |
| 4 | 100 | 50 | CP | Poor |
| 5 | 100 | 50 | EtOH | Good |
| 6 | 100 | 50 | MeOH | Poor |
| 7 | 100 | 40 | AcOEt | Excellent |
| | | EGOAc | | |
| 8 | 100 | 50 | THF | Excellent |
| 9 | 100 | 50 | Dioxane | Good |
| 10 | 100 | 50 | AcOEt | Excellent |
| 11 | 100 | 50 | CP | Poor |
| 12 | 100 | 50 | EtOH | Excellent |
| 13 | 100 | 50 | MeOH | Excellent |
| 14 | 100 | 40 | AcOEt | Excellent |

Similarly, experiments were performed to determine the best polymer-crosslinker concentration ratios using the same printing press and printing parameters as provided above. The tested concentration ratios are summarized in Table 6 below.

TABLE 6

| Entry | PVP (mg) | Crosslinker (mg) | Solvent (0.4 mL) | Quality |
|---|---|---|---|---|
| | | $C_6OAc$ | | |
| 1 | 100 | 50 | AcOEt | excellent |
| 2 | 100 | 60 | AcOEt | good |
| 3 | 100 | 40 | AcOEt | good |
| 4 | 100 | 30 | AcOEt | Poor |
| 5 | 100 | 20 | AcOEt | Poor |
| 6 | 100 | 10 | AcOEt | Excellent |
| 7 | 100 | 70 | AcOEt | Good |
| | | EGOAc | | |
| 8 | 100 | 50 | AcOEt | Excellent |
| 9 | 100 | 60 | AcOEt | Excellent |
| 10 | 100 | 40 | AcOEt | Excellent |
| 11 | 100 | 30 | AcOEt | Good |
| 12 | 100 | 20 | AcOEt | Poor |
| 13 | 100 | 50 | AcOEt | Excellent |
| 14 | 100 | 70 | AcOEt | Good |

In Tables 5 and 6, the dielectric quality was rated from excellent to poor based on the dielectric performance (leakage current, breakdown characteristics) as well as film morphological (roughness) and mechanical (robustness/solubility) characteristics.

EXAMPLE 14

Surface Morphology of Dielectric Films Printed from Precursor Compositions Containing Bifunctionalized-Silane Ethylene Glycol Crosslinkers AFM micrographs of dielectric films printed from optimized precursor compositions containing bifunctionalized-silane ethylene glycol crosslinkers were obtained (see Tables 5 and 6). These micrographs show that the optimized printed dielectric films exhibit a very smooth surface which is a prerequisite for good OFET charge transport.

Identifying the optimal composition of the dielectric precursor formulations (type of polymer, crosslinker, solvent, as well as polymer:crosslinker concentration ratio) is critical to achieve pinhole-free defect-free dielectric films. The quality of gravure-printed dielectric films fabricated using unoptimized and optimized formulations are significantly different, with films made from the optimized formulations being extremely smooth and defect-free, and films from the unoptimized formulations exhibiting a large number of defects and cracks.

EXAMPLE 15

Dielectric Data of Dielectric Films Printed from Precursor Compositions Containing Bifunctionalized-Silane Ethylene Glycol Crosslinkers Table 7 summarizes representative dielectric data (film roughness, capacitance ($C_i$) and breakdown voltage (BV)) of dielectric films printed from precursor compositions containing PVP and $C_6OAc$ or EGOAc, following procedures described in Examples 6, 8 and 13. Use of the ethylene glycol-based crosslinkers was shown to reduce film roughness and improve dielectric strength.

TABLE 7

| Entry | PVP(mg):$C_6OAc$(mg) (0.4 mL AcOEt) | Roughness (nm) | $C_i$ (nF/cm²) | BV (V) |
|---|---|---|---|---|
| 1 | 100:50 | 0.3-0.5 | 5-7 | >100 |
| 2 | 100:40 | 0.3-0.4 | 5-7 | >100 |
| 3 | 100:30 | 0.4-0.6 | 4-6 | >80 |
| 4 | 50:25 | 0.4-0.6 | 13-16 | >90 |
| 5 | 50:20 | 0.3-0.8 | 13-16 | >80 |
| 6 | 50:15 | 0.6-1.0 | 13-16 | >50 |

| Entry | PVP(mg):EGOAc(mg) (0.4 mL AcOEt) | Roughness (nm) | $C_i$ (nF/cm²) | BV (V) |
|---|---|---|---|---|
| 7 | 100:50 | 0.3-0.4 | 5-7 | >120 |
| 8 | 100:40 | 0.3-0.4 | 5-7 | >100 |
| 9 | 100:30 | 0.3-0.5 | 5-7 | >80 |
| 10 | 50:25 | 0.4-0.5 | 13-16 | >90 |
| 11 | 50:20 | 0.3-0.8 | 13-16 | >80 |
| 12 | 50:15 | 0.5-0.9 | 13-16 | >60 |

EXAMPLE 16

Insulating properties of dielectric films printed from precursor compositions containing thermally curable bifunctionalized-silane ethylene glycol crosslinkers The leakage current at various operating voltages was measured for the dielectric films of Example 16. FIG. 9 is a representative plot, using dielectric films of Entries 7 and 10 from Example 16. These films were shown to have good insulating properties.

EXAMPLE 17

Device Performance of OFET Fabricated with Dielectric Films Printed From Precursor Compositions Containing Thermally Curable Bifunctionalized-Silane Ethylene Glycol Crosslinkers Pentacene transistors fabricated on the printed dielectric films from Example 15 were found to exhibit excellent device performance. FIGS. 10A and 10B are representative transfer and output plots for one of the printed PVP-EGOAc formulations (Entry 7, Table 7). All OTFT measurements described herein were carried out in air using a Keithly 6430 subfemtoammeter and a Keithly 2400 source meter, operated by a local Labview program and GPIB communication. Triaxial and/or coaxial shielding was incorporated into Signaton probe stations to minimize the noise level. A digital capacitance meter (Model 3000, GLK Instruments) and an HP4192A Impedance Analyzer were used for capacitance measurements.

Compatibility with various p-type and n-type semiconductors was also demonstrated. FIGS. 11A and 11B provide output plots for OFETs fabricated with the printed PVP-EGOAc formulation of Entry 7 in Table 5 as the dielectric component and, as the semiconductor component N,N'-bis(n-octyl)-(1,7 and 1,6)-dicyanoperylene-3,4:9,10-bis(dicarboximide) (PDI-8CN$_2$) and 5,5'-di-(p-hexylphenyl)-2,2'-bithiophene (DH-PTTP), respectively. PDI-8CN$_2$ was prepared according to the procedures described in U.S. Patent Application Publication No. US 2005/0176970, the disclosure of which is incorporated by reference herein.

It was also found that very high carrier mobilities ($\mu$) and current on-off ratios ($I_{on}:I_{off}$) could be achieved by OFETs fabricated with the dielectric films of the present teachings, implying very low charge trapping states and good semiconductor film crystallinity. Table 8 summarizes data (carrier mobilities, current on-off ratios) related to OFET performance for different semiconductors (pentacene, PDI-8CN$_2$, DFHCO-4T, and dihexylsexithiophene (DH-6T)) on a variety of dielectric films of the present teachings. DH-6T was prepared according to the procedures described in U.S. Pat. No. 6,585,914, the disclosure of which is incorporated by reference herein. In all cases, the transistors were active and the reported carrier mobilities were among the highest obtained for these semiconductor materials.

TABLE 8

| Entry | PVP(mg):C$_6$OAc(mg) (0.4 mL AcOEt) | Semiconductor | $\mu$ (cm$^2$/Vs) | $I_{on}:I_{off}$ |
|---|---|---|---|---|
| 1 | Not measured | Not measured | Not measured | Not measured |
| 2 | 100:50 (ITO) | Pentacene | 10-90 | 4-6 × 10^4 |
| 3 | 100:40 (ITO) | Pentacene | 5-20 | 2-3 × 10^4 |
| 4 | 100:30 (ITO) | Pentacene | 4-15 | 1-2 × 10^4 |
| 5 | 100:50 (Al) | Pentacene | 4-30 | 1-2 × 10^4 |
| 6 | 50:25 (Al) | Pentacene | 10-20 | 4-6 × 10^4 |
| 7 | 100:50 (ITO) | DH-6T | 0.006-0.008 | 1-5 × 10^2 |
| 8 | 100:50 (ITO) | PDI-8CN$_2$ | 0.08 | 1-5 × 10^2 |
| 10 | 100:40 (ITO) | PDI-8CN$_2$ | 0.06 | 1-5 × 10^2 |
| 11 | 100:30 (ITO) | PDI-8CN$_2$ | 0.05 | 1-5 × 10^2 |
| 12 | 100:30 (ITO) | DFHCO-4T | 0.05 | 1-5 × 10^3 |

| Entry | PVP(mg):EGOAc(mg) (0.4 mL AcOEt) | Semiconductor | $\mu$ (cm$^2$/VS) | $I_{on}:I_{off}$ |
|---|---|---|---|---|
| 13 | 100:50 (Al) | Pentacene | 5-10 | 1-2 × 10^6 |
| 14 | 100:40 (Al) | Pentacene | 5-7 | 2-3 × 10^6 |
| 15 | 50:25 (Al) | Pentacene | 5-7 | 1-2 × 10^6 |
| 16 | 100:50 (ITO) | Pentacene | 10-15 | 4-6 × 10^5 |

Carrier mobility has been calculated in saturation.

WAXRD (wide angle x-ray diffraction) spectra of pentacene as well as PDI-8CN$_2$ and DH-6T on dielectric films of the present teachings (not shown) exhibit sharp multiple reflections demonstrating a great degree of texture.

Printed OFETs can be mechanically flexible.

EXAMPLE 18

Dielectric Properties of Dielectric Films Prepared from Precursor Compositions Containing Polymeric Crosslinkers Tables 9 and 10 summarize the properties of various dielectric films obtained from different polymer-crosslinkable copolymer precursor formulations having the formula:

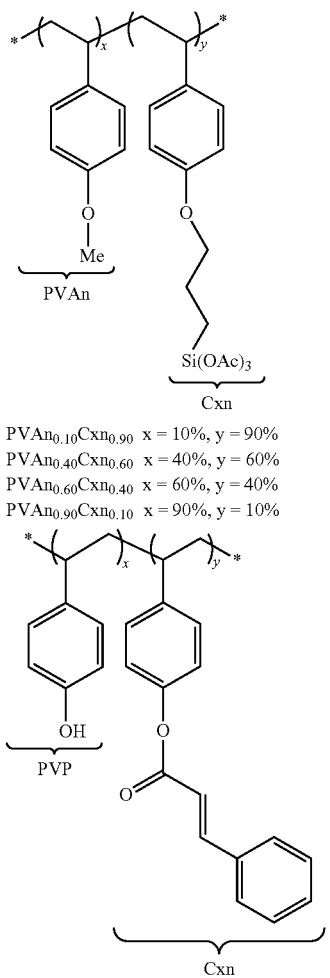

PVAn$_{0.10}$Cxn$_{0.90}$  x = 10%, y = 90%
PVAn$_{0.40}$Cxn$_{0.60}$  x = 40%, y = 60%
PVAn$_{0.60}$Cxn$_{0.40}$  x = 60%, y = 40%
PVAn$_{0.90}$Cxn$_{0.10}$  x = 90%, y = 10%

PVP$_{0.75}$Cxn$_{0.25}$  x = 75%, y = 25%
PVP$_{0.50}$Cxn$_{0.50}$  x = 50%, y = 50%
PVP$_{0.25}$Cxn$_{0.75}$  x = 25%, y = 75%

Table 9 shows that relatively high capacitance films can be fabricated both by spin-coating and printing various precursor formulations employing a thermally curable polymeric crosslinker having the formula:

TABLE 9

| Entry | Ink Composition | | | CPB Film | | |
|---|---|---|---|---|---|---|
| | PVP (mg) | PVAn$_{0.1}$Cxn$_{0.9}$ (mg) | Solvent | Deposition Method | Quality | $C_i$ (nF/cm$^2$) | BV (V) |
| 1 | 60 | 10 | Dioxane (2 mL) | SC | | 63-64 | >60 |
| 2 | 60 | 20 | Dioxane (2 mL) | SC | excellent | 54-55 | >60 |
| 3 | 60 | 40 | Dioxane (2 mL) | SC | good | 34-35 | >60 |
| 4 | 60 | 40 | Dioxane (2 mL) | SC | good | 32-33 | >60 |
| 5 | 120 | 40 | AcOEt (0.6 mL) | Print | | 12-13 | >60 |
| 6 | 120 | 40 | AcOEt (0.6 mL) | Print | excellent | 17-18 | >60 |
| 7 | 120 | 40 | AcOEt (1.0 mL) | Print | excellent | 18-19 | >60 |

Table 10 shows that relatively high capacitance films can be fabricated both by spin-coating and printing various photochemically curable polymer-crosslinkable copolymer precursor formulations.

TABLE 10

| Entry | Ink Composition | | | | CPB Film | | |
|---|---|---|---|---|---|---|---|
| | PVP (mg) | PVP$_x$Cxn$_y$ (mg) | EGOAc (mg) | Solvent | Method (Curing) | Quality | $C_i$ (nF/cm2) | BV (V) |
| 1 | 100 | 0 | 50 | AcOEt (0.4 mL) | Print (i) | | 14-16 | >80 |
| 2 | 80 | 0 | 80 | Dioxane (2 mL) | SC (i) | excellent | 14-16 | >80 |
| 3 | 40 | 0 | 40 | Dioxane (2 mL) | SC (i) | excellent | 28-32 | >70 |
| 4 | 20 | 0 | 20 | THF (2 mL) | SC (i) | good | 80-90 | >60 |
| 5 | 100 | 0 | 30 | AcOEt (0.4 mL) | Print (i) | excellent | 5-7 | >80 |
| 6 | 50 | 0 | 25 | AcOEt (0.4 mL) | Print (i) | good | 13-16 | >90 |
| 7 | 0 | 40 | 30 | Dioxane (2 mL) | SC (iv) | excellent | 38-39 | >90 |
| 8 | 0 | 40 | 20 | Dioxane (2 mL) | SC (iv) | excellent | 41-42 | >90 |
| 10 | 0 | 40 | 10 | Dioxane (2 mL) | SC (iv) | excellent | 43-45 | >90 |
| 11 | 0 | 40 | 0 | Dioxane (2 mL) | SC (iv) | good | 42-43 | >90 |
| 12 | 0 | 40 | 30 | Dioxane (2 mL) | SC (iii) | excellent | 37-39 | >90 |
| 13 | 0 | 40 | 20 | Dioxane (2 mL) | SC (iii) | excellent | 41-43 | >90 |
| 14 | 0 | 40 | 10 | Dioxane (2 mL) | SC (iii) | good | 43-45 | >90 |
| 14 | 0 | 40 | 0 | Dioxane (2 mL) | SC (iii) | good | 42-43 | >90 |
| 15 | 0 | 100 | 50 | AcOEt (0.4 mL) | Print (iv) | poor | 8-20 | >60 |
| 16 | 0 | 200 | 100 | AcOEt (0.3 mL) | Print (iv) | poor | 8-16 | >60 |
| 17 | 0 | 200 | 0 | AcOEt (0.3 mL) | Print (iv) | excellent | 12-13 | >60 |
| 18 | | 200 | 50 | AcOEt (0.3 mL) | Print (iv) | excellent | 12-13 | >90 |
| 19 | 100 | 100 | 50 | AcOEt (0.3 mL) | Print (iv) | excellent | 12-13 | >90 |
| 20 | 100 | 50 | 50 | AcOEt (0.3 mL) | Print (iv) | excellent | 15-16 | >90 |

As shown in Table 10, crosslinked polymeric dielectric films of excellent quality were fabricated by spin-coating or printing various precursor formulations including a conventional polymer such as PVP, a thermally curable crosslinker such as EGOAc, and optionally a photochemically curable polymeric crosslinker such as PVP$_x$Cxn$_y$. Referring back to FIG. 1, different crosslinking strategies (ii-iv) were employed (using the same numbering schemes).

Figure 12:
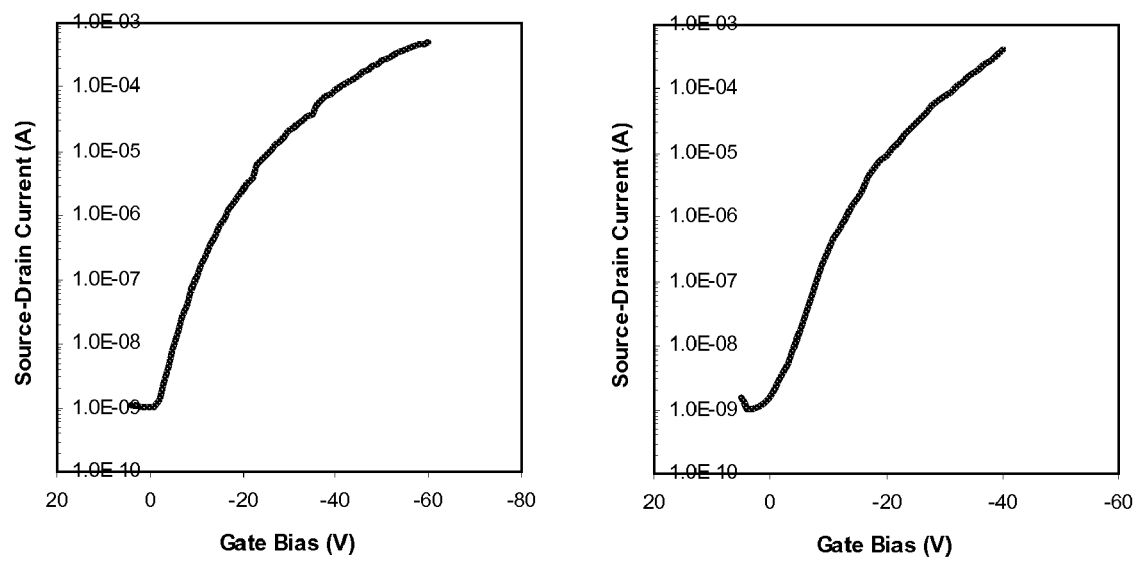
FIG. 12 provides the transfer plots of two pentacene OFETs including gate dielectrics of the present teachings.

Using these thermally and/or photochemically curable dielectric materials, high-performance OFETs were fabricated on patterned dielectrics. FIG. 12 shows the transfer plots for pentacene transistors exhibiting carrier mobilities close to 30 cm$^2$/Vs and current on-off ratios greater than 10$^5$, demonstrating the great potential of the compositions and processes of the present teachings.

The invention may be embodied in other specific forms without departing from the spirit or essential characteristics thereof. The foregoing embodiments are therefore to be considered in all respects illustrative rather than limiting on the present teachings described herein. Scope of the invention is thus indicated by the appended claims rather than by the foregoing description, and all changes that come within the meaning and range of equivalency of the claims are intended to be embraced therein.

What is claimed is:

1. An electronic device comprising a semiconductor component and a dielectric material, wherein the dielectric material comprises a crosslinked polymeric material comprising a thermally cured product of a precursor composition, the precursor composition comprising: (1) a polymeric component and a thermally curable crosslinker, (2) a thermally curable polymeric crosslinker, or both (1) and (2), wherein:

the thermally curable crosslinker of (1) has the formula:

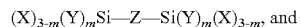
$(X)_{3-m}(Y)_m Si\text{---}Z\text{---}Si(Y)_m(X)_{3-m}$, and the thermally curable polymeric crosslinker of (2) comprises a pendant group comprising a crosslinking moiety having the formula:

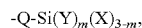
-Q-Si(Y)$_m$(X)$_{3-m}$, wherein:

Q, at each occurrence, independently is selected from the group consisting of -L-, —O—, —O-L, -L-O—, —NR$^4$—, —NR$^4$-L-, -L-NR$^4$—, and a covalent bond;

X, at each occurrence, independently is selected from the group consisting of a halogen, —NR$^1$R$^2$, —OR$^3$, and —OC(O)R$^3$;

Y, at each occurrence, independently is selected from the group consisting of H, a C$_{1-6}$ alkyl group, and a C$_{1-6}$ haloalkyl group;

Z is Q-W-Q, provided that Q and W do not combine to form a moiety selected from the group consisting of —O—, a divalent C$_{1-20}$ alkyl group, and a covalent bond; and m, at each occurrence, independently is 0, 1, or 2;
wherein:
L, at each occurrence, independently is a divalent $C_{1-10}$ alkyl group or a divalent $C_{1-10}$ haloalkyl group, each of which optionally is substituted with 1-4 $R^4$ groups;
W is selected from the group consisting of —SiXX—, —SiXY—, —SiYY—, —SiXX—O—, —O—SiXX—, —SiXY—O—, —O—SiXY—, —SiYY—O—, —O—SiYY—, —O—{[CR$^4_2$)$_t$—O]$_p$—[CR$^5_2$)$_t$-O]$_q$}—, a divalent $C_{6-14}$ aryl group, a divalent 5-14 membered heteroaryl group, and a covalent bond, wherein each of the divalent $C_{6-14}$ aryl group and the divalent 5-14 membered heteroaryl group is optionally substituted with 1-4 $R^4$ groups;
$R^1$ and $R^2$ independently are selected from the group consisting of H, a $C_{1-6}$ alkyl group, a $C_{6-14}$ aryl group, a 5-14 membered heteroaryl group, a —$C_{1-6}$alkyl-$C_{6-14}$aryl group, and a —$C_{1-6}$ alkyl-5-14 membered heteroaryl group;
$R^3$ is selected from the group consisting of H, a $C_{1-6}$ haloalkyl group, a $C_{2-6}$ alkenyl group, a $C_{2-6}$ alkynyl group, a $C_{6-14}$ aryl group, a 5-14 membered heteroaryl group, a —$C_{1-6}$ alkyl group, $C_{6-14}$ aryl group, and a —$C_{1-6}$ alkyl-5,14 membered heteroaryl group;
$R^4$ and $R^5$, at each occurrence, independently are selected from the group consisting of H, a halogen, a $C_{1-6}$ alkyl group, a $C_{1-6}$ haloalkyl group, a $C_{6-14}$ aryl group, a 5-14 membered heteroaryl group, a —$C_{1-6}$ alkyl —$C_{6-14}$ aryl group, a —$C_{1-6}$ alkyl-5-14 membered heteroaryl group, and -Q-Si(Y)$_m$(X)$_{3-m}$;
p is 0, 1, 2, 3, 4, 5, 6, 7, 8, 9, 10, 11, 12, 13, 14, 15, 16, 17, 18 or 19; and
q is 1, 2, 3, 4, 5, 6, 7, 8, 9, 10, 11, 12, 13, 14, 15, 16, 17, 18, 19 or 20, provided that p+q≦20; and
t, at each occurrence, independently is 1, 2, 3, 4, 5, or 6.

2. The electronic device of claim 1, wherein the polymeric component of (1) comprises one or more polymers selected from the group consisiting of polyethylene, polypropylene, polyvinylalcohol, polystyrene, a ring-functionalized derivative of polystyrene, polyacrylate, a siloxane polymer, and copolymers thereof.

3. The electronic device of claim 1, wherein the polymeric component of (1) comprises one or more polymers selected from the group consisiting of poly(4-vinyl phenol), poly(styrene), poly(vinyl alcohol), poly(methylmethacrylate), and poly(4-vinyl phenol-co-styrene).

4. The electronic device of claim 1, wherein
W is selected from the group consisting of —O—[(CH$_2$)$_2$—O]$_t$—, —O—[(CF$_2$)$_2$—O]$_t$—, and a divalent phenyl group; and t is as defined in claim 1.

5. The electronic device of claim 1, wherein
Z is —(CH$_2$)$_t$—O—[(CH$_2$)$_2$—O]$_t$—(CH$_2$)$_t$—; and t is as defined in claim 1.

6. The electronic device of claim 1, wherein X, at each occurrence, independently is selected from the group consisting of Cl, OCH$_3$, OCH$_2$CH$_3$, —N(CH$_3$)$_2$—, —N(CH$_2$CH$_3$)$_2$—, —OC(O)CH$_3$, and —OC(O)CH$_2$CH$_3$; and Y, at each occurrence, independently is selected from the group consisting of H, CF$_3$, a methyl group, and an ethyl group.

7. The electronic device of claim 1, wherein the precursor composition comprises the thermally curable crosslinker of (1) selected from the group consisting of:

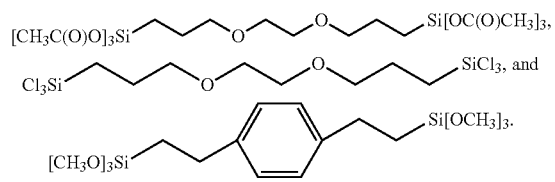

8. The electronic device of claim 1, wherein the precursor composition comprises the thermally curable polymeric crosslinker of (2) having the formula:

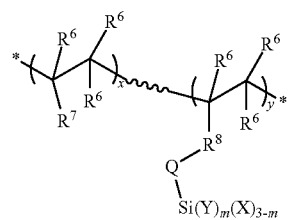

wherein
$R^6$, at each occurrence, independently is H, a halogen, or a $C_{1-6}$ alkyl group;
$R^7$ is selected from the group consisting of H, OH, a halogen, C(O)O—$R^3$, a $C_{1-6}$ alkyl group, a $C_{1-6}$ haloalkyl group, a $C_{6-14}$ aryl group, a 5-14 membered heteroaryl group, a 3-14 membered cycloheteroalkyl group, a —$C_{1-6}$ alkyl-$C_{6-14}$ aryl group, a —$C_{1-6}$ alkyl-5-14 membered heteroaryl group, and a —$C_{1-6}$ alkyl-3-14 membered cycloheteroalkyl group, wherein each of the $C_{6-14}$ aryl groups, the 5-14 membered heteroaryl groups, and the 3-14 membered cycloheteroalkyl groups is optionally substituted with 1-5 substituents independently selected from the group consisting of a halogen, an oxo group, OH, CN, NO$_2$, —C(O)O—$C_{1-6}$ alkyl, a $C_{1-6}$ alkyl group, a $C_{1-6}$ alkoxy group, and a $C_{1-6}$ haloalkyl group;
$R^8$ is selected from the group consisting of —O—, —C(O)O—, a divalent $C_{1-6}$ alkyl group, and a divalent phenyl group;
x and y independently are a real number, wherein 0<x<1, 0<y<1, and x+y=1; and
Q, X, Y and m are as defined in claim 1.

9. The electronic device of claim 1, wherein the precursor composition comprises the thermally curable polymeric crosslinker of (2) having the formula:

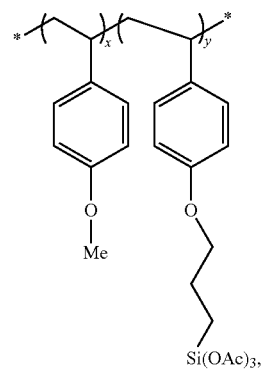

wherein x and y independently are a real number, wherein 0<x<1, 0<y<1, and x+y=1.

10. The electronic device of claim 1, wherein the precursor composition further comprises (3) a photochemically curable crosslinker, (4) a photochemically curable polymeric crosslinker, or both (3) and (4).

11. The electronic device of claim 1, wherein the precursor composition further comprises a photochemically curable polymeric crosslinker having the formula:

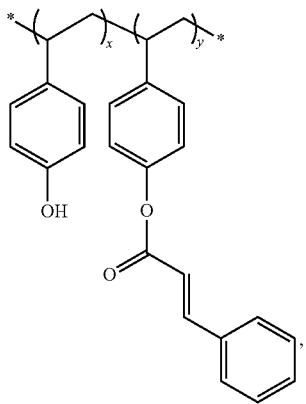

wherein x and y independently are a real number, wherein 0<x<1, 0<y<1, and x+y=1.

12. The electronic device of claim 11, wherein the precursor composition comprises

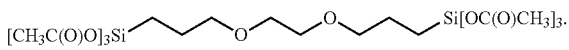

as the thermally curable crosslinker of (1).

13. The electronic device of claim 1, wherein the dielectric material further comprises a plurality of metal oxide particles, the metal oxide particles comprising a metal component selected from the group consisting of a Group I metal, a Group II metal, a Group III metal, a Group IV metal, a transition metal, and combinations thereof.

14. The electronic device of claim 1, wherein the dielectric material has a thickness of less than about 50 nm.

15. The electronic device of claim 1, wherein the electronic device is a thin film transistor, a field-effect device, an organic light-emitting diode, an organic photovoltaic device, a photodetector, a capacitor, or a sensor.

16. The electronic device of claim 1 configured as a thin film transistor.

17. The electronic device of claim 1 comprising an n-type organic semiconductor material.

18. The electronic device of claim 1 comprising a p-type organic semiconductor material.

19. The electronic device of claim 1 comprising an inorganic semiconductor material.

20. The electronic device of claim 1 comprising a substrate selected from the group consisting of doped silicon, indium tin oxide (ITO), ITO-coated glass, ITO-coated mylar, aluminum, and doped polythiophene.

* * * * *